(12) United States Patent
Jang

(10) Patent No.: US 11,417,692 B2
(45) Date of Patent: Aug. 16, 2022

(54) IMAGE SENSING DEVICE

(71) Applicant: SK hynix Inc., Icheon-si (KR)

(72) Inventor: Jae Hyung Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/234,392

(22) Filed: Apr. 19, 2021

(65) Prior Publication Data
US 2022/0013559 A1  Jan. 13, 2022

(30) Foreign Application Priority Data
Jul. 7, 2020  (KR) .......................... 10-2020-0083182

(51) Int. Cl.
| | |
|---|---|
| *H04N 5/374* | (2011.01) |
| *H04N 5/378* | (2011.01) |
| *G01S 17/89* | (2020.01) |
| *H01L 27/146* | (2006.01) |
| *H04N 5/3745* | (2011.01) |
| *G01S 17/894* | (2020.01) |

(52) U.S. Cl.
CPC ..... *H01L 27/14614* (2013.01); *H04N 5/3745* (2013.01); *G01S 17/894* (2020.01)

(58) Field of Classification Search
CPC ...... H04N 5/3745; H04N 5/374; H04N 5/378; H01L 27/14614; H01L 27/14603; H01L 27/14605; G01S 17/894
See application file for complete search history.

(56) References Cited

U.S. PATENT DOCUMENTS

| | | | | |
|---|---|---|---|---|
| 2014/0197464 | A1* | 7/2014 | Ihara | H01L 27/14614 257/229 |
| 2015/0054998 | A1 | 2/2015 | Kanou | |
| 2015/0155328 | A1* | 6/2015 | Park | H01L 27/14645 250/208.1 |
| 2018/0190697 | A1* | 7/2018 | Lee | H01L 27/14603 |
| 2018/0197910 | A1* | 7/2018 | Lee | H01L 27/14605 |
| 2019/0296060 | A1* | 9/2019 | Oh | H01L 27/14607 |
| 2020/0075652 | A1* | 3/2020 | Chen | H01L 27/14621 |
| 2020/0119060 | A1* | 4/2020 | Altice | H04N 5/363 |
| 2020/0286938 | A1* | 9/2020 | Jin | H01L 27/14605 |
| 2021/0385399 | A1* | 12/2021 | Jang | G01S 7/4863 |
| 2022/0102395 | A1* | 3/2022 | Yoon | H01L 27/146 |

FOREIGN PATENT DOCUMENTS

| | | |
|---|---|---|
| KR | 20140093029 A | 7/2014 |
| KR | 20150062487 A | 6/2015 |

* cited by examiner

*Primary Examiner* — Marly S Camargo
(74) *Attorney, Agent, or Firm* — Perkins Coie LLP

(57) ABSTRACT

An image sensing device includes a plurality of image sensor pixels including a first image sensor pixel and a second image sensor pixel and a transmission driver. The transmission driver is coupled to first and second transfer gates to apply a first transmission signal to the first transfer gate to control the first transfer gate and a second transmission signal to the second transfer gate to control the second transfer gate. A first distance between the first image sensor pixel and the transmission driver is shorter than a second distance between the second image sensor pixel and the transmission driver, and the first and second transfer gates of the first image sensor pixel are different in structure from the first and second transfer gates of the second image sensor pixel, respectively.

15 Claims, 11 Drawing Sheets

IMAGE SENSING DEVICE

CROSS-REFERENCE TO RELATED APPLICATION

This patent document claims the priority and benefits of Korean patent application No. 10-2020-0083182, filed on Jul. 7, 2020, the disclosure of which is incorporated herein by reference in its entirety as part of the disclosure of this patent document.

TECHNICAL FIELD

The technology and implementations disclosed in this patent document generally relate to an image sensing device for sensing a distance to a target object.

BACKGROUND

An image sensor is used to convert light into electrical signals using a semiconductor material that reacts to light. With the recent development of automotive, medical, computer and communication industries, the demand for high-performance image sensors has been increasing in various devices such as smartphones, digital cameras, game consoles, Internet of Things (IoT), robots, surveillance cameras, medical micro-cameras.

Image sensors may be broadly classified into CCD (Charge Coupled Device) image sensors and CMOS (Complementary Metal Oxide Semiconductor) image sensors. The CCD image sensors may create high-quality, low-noise images, and traditionally have advantages over the CMOS image sensor in terms of noise characteristics. However, CMOS image sensors have a simpler, more convenient way to capture the images, and thus are preferred in some applications. In addition, CMOS image sensors may allow a signal processing circuit to be integrated into a single chip, which makes it easy to miniaturize electronic devices including CMOS image sensors, with the added benefit of consuming very low power. CMOS image sensors can be implemented using CMOS fabrication technology at low manufacturing costs. For these reasons, CMOS image sensors are now being widely used in mobile devices.

SUMMARY

The embodiments of the disclosed technology relate to an image sensing device including a plurality of pixels having uniform characteristics regardless of their locations in the pixel array.

In an embodiment of the disclosed technology, an image sensing device may include a substrate, an image sensor pixel array supported by the substrate and structured to include a plurality of image sensor pixels that generate photocharges in response to light, the plurality of image sensor pixels including a first image sensor pixel and a second image sensor pixel, each of the first and second image sensor pixels including a first transfer gate and a second transfer gate, the first transfer gate structured to transfer photocharges generated during a first period to a first region structured to hold the photocharges, the second transfer gate structured to transfer photocharges generated during a second period to a second region structured to hold the photocharges, and a transmission driver coupled to the first and second transfer gates, and configured to apply a first transmission signal to the first transfer gate to control the first transfer gate and a second transmission signal to the second transfer gate to control the second transfer gate. A first distance between the first image sensor pixel and the transmission driver is shorter than a second distance between the second image sensor pixel and the transmission driver, and the first and second transfer gates of the first image sensor pixel are different in structure from the first and second transfer gates of the second image sensor pixel, respectively.

In another embodiment of the disclosed technology, an image sensing device may include an image sensor pixel array including a plurality of image sensor pixels structured to include photoelectric conversion elements, respectively, that generate photocharges in response to light, each of the plurality of image sensor pixels including a first floating diffusion region adjacent to a corresponding photoelectric conversion element, a first transfer gate coupled between the photoelectric conversion element and the first floating diffusion region, a second floating diffusion region adjacent to the photoelectric conversion element but separate from the first floating diffusion region, and a second transfer gate coupled between the photoelectric conversion element and the second floating diffusion region, the first transfer gate structured to be operable to transfer first photocharges generated in the corresponding photoelectric conversion element during a first period to the first floating diffusion region which holds the first photocharges, and the second transfer gate structured to be operable to transfer second photocharges generated in the corresponding photoelectric conversion element during a second period to the second floating diffusion region which holds the second photocharges, and a transmission driver coupled to the first and second transfer gates and configured to apply a first transmission signal to the first transfer gate to operate the first transfer gate to transfer the first photocharges and a second transmission signal to the second transfer gate to operate the second transfer gate to transfer the second photocharges. The plurality of image sensor pixels includes first to third image sensor pixels that have different signal transmission distances from the transmission driver, and the first transfer gate of the first image sensor pixel, the first transfer gate of the second image sensor pixel and the first transfer gate of the third image sensor pixel have different structures, including at least one of a depth of the first transfer gate in a substrate, a material of a gate electrode of the first transfer gate, a thickness of a gate insulation layer of the first transfer gate, or a material of the gate insulation layer.

In another embodiment of the disclosed technology, an image sensing device may include a pixel array including a plurality of pixels, each of which includes a first transfer gate for transferring photocharges generated in a first period and a second transfer gate for transferring photocharges generated in a second period, and a transmission driver configured to supply a first transmission signal to be input to the first transfer gate and a second transmission signal to be input to the second transfer gate. The distance between a first pixel of the pixel array and the transmission driver may be shorter than a distance between a second pixel of the pixel array and the transmission driver. The first transfer gate of the first pixel may be different in structure from the first transfer gate of the second pixel. The second transfer gate of the first pixel may be different in structure from the second transfer gate of the second pixel.

In an embodiment of the disclosed technology, an image sensing device may include a pixel array including a plurality of pixels, each of which includes a first transfer gate for transferring photocharges generated in a first period and a second transfer gate for transferring photocharges generated in a second period, and a transmission driver configured to supply a first transmission signal to be input to the first transfer gate and a second transmission signal to be input to the second transfer gate. The pixel array may include first to third pixels that are sequentially far from the transmission driver such that a distance to the transmission driver sequentially increases in a direction from the first pixel to the third pixel. The first transfer gate of the first pixel and the first transfer gate of the second pixel may be different in structure from each other. Here, the different structures may include at least one of a depth of the first transfer gate, a material of a gate electrode included in the first transfer gate, a thickness of a gate insulation layer included in the first transfer gate, and a material of the gate insulation layer.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
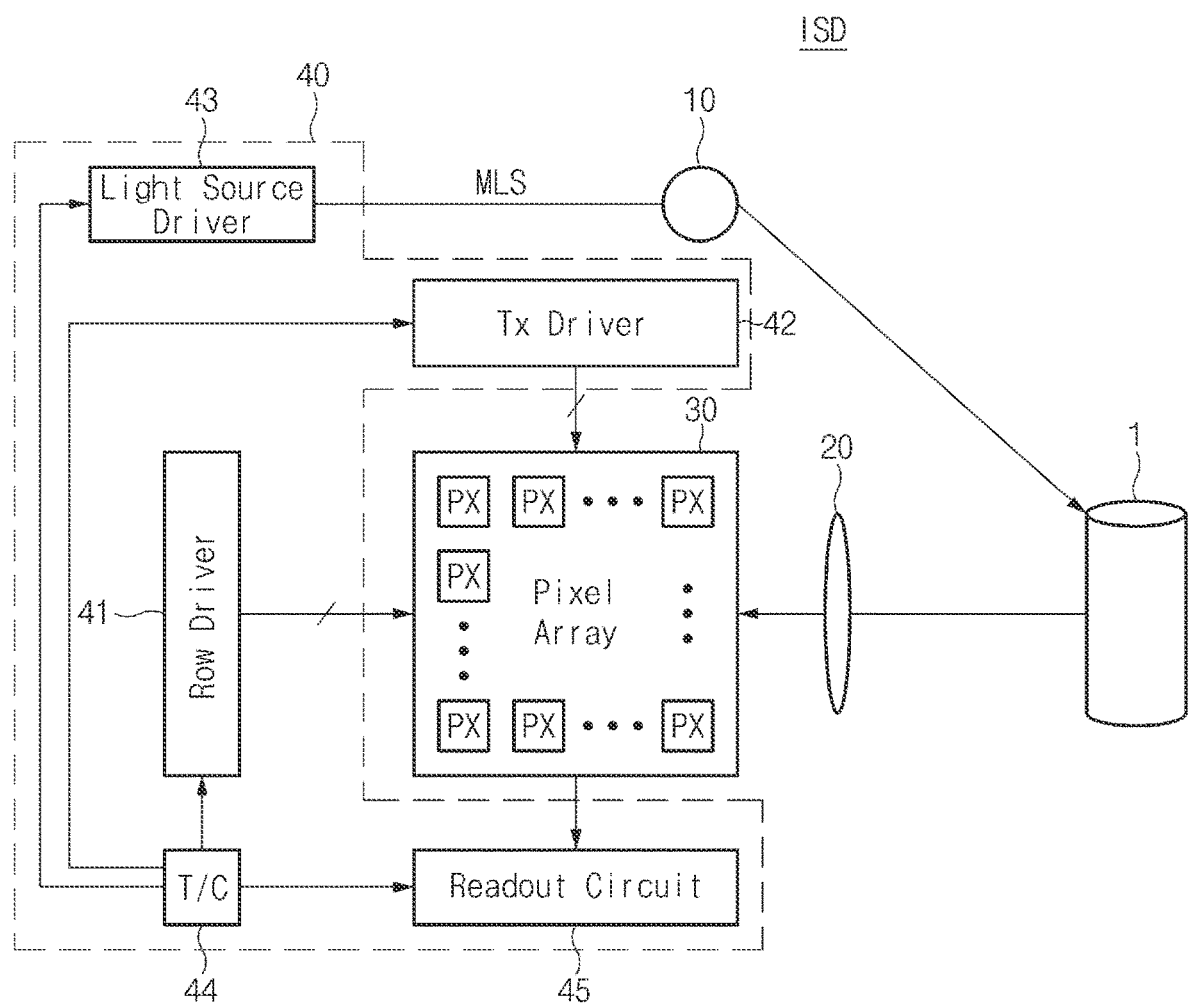
FIG. 1 is a schematic diagram illustrating an example of an image sensing device based on some implementations of the disclosed technology.

This patent document provides implementations and examples of an image sensing device that substantially addresses one or more issues due to limitations and disadvantages of the related art. Some implementations of the disclosed technology relate to an image sensing device that includes a plurality of image sensor pixels having uniform characteristics regardless of their locations in the pixel array.

The disclosed technology provides various implementations of an image sensing device which can enable a transfer gate to be formed in different ways depending on the location of the image sensor pixels, reducing noise that would have caused by IR drop (e.g., voltage drop) from a pixel signal.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein, but on the contrary, the disclosure is intended to cover all modifications, equivalents, and alternatives falling within the spirit and scope of the embodiments.

With increasing demands for techniques that enable the distance measurement to the object in various devices, such as security devices, medical devices, automobiles, game consoles, virtual reality (VR)/augmented reality (AR) devices, and mobile devices, there have been much developments and studies for the measurement of range and depth information using image sensors. Methods for measuring depth information using image sensors include, among others, a triangulation method, a Time of Flight (TOF) method, and an interferometry method. Among above-mentioned depth measurement methods, the TOF method is considered as one of the most promising techniques thanks to its wide range of utilization, high processing speed, and cost advantages. As a basic principle, the TOF method measures a distance using emitted light and reflected light. Depending on the application, there are different types of TOF methods. For example, a direct TOF method measures the distance to the object based on a round trip time of the emitted light and reflected light, and an indirect TOF method measures the distance to the object based on a phase difference of the emitted light and reflected light. The direct method is suitable for a long-distance measurement and thus is widely used in automobiles. The indirect method is suitable for a short-distance measurement and thus is widely used in systems and devices designed to operate at a higher speed, for example, game consoles, mobile cameras, or others. As compared to the direct type TOF systems, the indirect method may be implemented using simpler circuitry with low memory requirements at a relatively low cost.

FIG. 1 is a block diagram illustrating an example of an image sensing device ISD based on some implementations of the disclosed technology.

Referring to FIG. 1, the image sensing device ISD may measure the distance to a target object 1 using the Time of Flight (TOF) method. The image sensing device may include a light source 10, a lens module 20, a pixel array 30, and a control block 40. In this patent document, the word "pixel" can be used to indicate an image sensor pixel that includes a photoconversion device such as a photodiode having a p-region and n-region in a substrate to generate photocharges in response to light, a floating diffusion region structured to hold the photocharges generated by the photoconversion device, and a transfer gate structured to transfer photocharges from the photoconversion device to the floating diffusion region.

The light source 10 may emit light toward a target object 1 upon receiving a clock signal MLS (modulated light signal) from the control block 40. The light source 10 may be a laser diode (LD) or a light emitting diode (LED) for emitting light (e.g., near infrared (NIR) light, infrared (IR) light or visible light) having a specific wavelength band, or may be any one of a near infrared laser (NIR), a point light source, a monochromatic light source in which a white lamp is combined with a monochromator, and a combination of other laser sources. For example, the light source 10 may emit infrared light having a wavelength of 800 nm to 1000 nm. Light emitted from the light source 10 may be light modulated by a predetermined frequency. Although the image sensing device ISD in FIG. 1 is illustrated as having one light source 10, the image sensing device ISD may include a plurality of light sources arranged in the vicinity of the lens module 20.

The lens module 20 may collect light reflected from the target object 1 and focus the collected light onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in rows and columns. The unit pixels (PXs) may be formed over a semiconductor substrate. Each unit pixel (PX) may convert incident light received through the lens module 20 into an electrical signal corresponding to the amount of incident light rays or the intensity of the incident light, and may output a pixel signal (e.g., digital signal) using the electrical signal (e.g., analog signal). In some implementations, the pixel signal may be a signal indicating the distance to the target object 1, instead of the color of the target object 1. The structure and operations of each unit pixel (PX) will hereinafter be described with reference to the drawings from FIG. 2A.

The control block 40 may control the operations of the light source 10 to emit light toward the target object 1. The control block 40 may also process each pixel signal that is corresponding to light reflected from the target object 1 and generated by unit pixels (PXs) of the pixel array 30, and may measure the distance to the surface of the target object 1 using the processed pixel signals.

The control block 40 may include a row driver 41, a transmission (Tx) driver 42, a light source driver 43, a timing controller 44, and a readout circuit 45.

In the patent document, the word "control circuit" can be used to indicate driver circuits such as the row driver 41 and the transmission (Tx) driver 42.

The control block 40 may drive unit pixels (PXs) of the pixel array 30 in response to a timing signal generated from the timing controller 44.

The control block 40 may generate control signals that are used to select row lines. The control signal may include a reset signal for controlling a reset transistor, a transmission (Tx) signal for controlling a corresponding circuit to transfer photocharges accumulated in a photoelectric conversion element in a substrate to a region (e.g., floating diffusion region) structured to hold the photocharges transferred from the photoelectric conversion element, and a selection signal for controlling a selection transistor.

The row driver 41 may generate the reset signal and the selection signal, and the transmission (Tx) driver 42 may generate the transmission (Tx) signal.

The light source driver 43 may generate a modulated light signal MLS for operating the light source 10 in response to a control signal from the timing controller 44. The modulated light signal MLS may be a signal that is modulated at a predetermined frequency.

The timing controller 44 may generate a timing signal to control the row driver 41, the transmission (Tx) driver 42, the light source driver 43, and the readout circuit 45.

The readout circuit 45 may process pixel signals received from the pixel array 30 in response to control signals of the timing controller 44, and may thus generate digital pixel data. To this end, the readout circuit 45 may include a correlated double sampler (CDS) circuit for performing correlated double sampling (CDS) on the pixel signals generated from the pixel array 30. In addition, the readout circuit 45 may include an analog-to-digital converter (ADC) for converting output signals of the CDS circuit into digital signals. In addition, the readout circuit 45 may include a buffer circuit that temporarily stores pixel data generated from the analog-to-digital converter (ADC) and outputs the pixel data under control of the timing controller 44. In some implementations, each pixel (PX) of the pixel array 30 may generate two different pixel signals. Therefore, two column lines for transmitting the pixel signal of each pixel (PX) to the readout circuit 45 may be assigned to each column of the pixel array 30, and other circuitry may be used to process the pixel signal generated from corresponding column lines.

The light source 10 may emit light modulated at a predetermined frequency toward a scene or object captured by the image sensing device ISD. The image sensing device ISD may sense or detect the modulated light reflected from the target objects 1, and may generate depth information for each unit pixel (PX) based on a time delay between the modulated light and the incident light that occurs due to the distance between the image sensing device ISD and each target object 1. The time delay may be expressed using a phase difference between the signal generated by the image sensing device ISD and the light modulation signal MLS controlling the light source 10. An image processor (not shown) may calculate a phase difference generated in the output signal of the image sensing device ISD to generate a depth image including depth information for each unit pixel (PX).

Figure 2A:
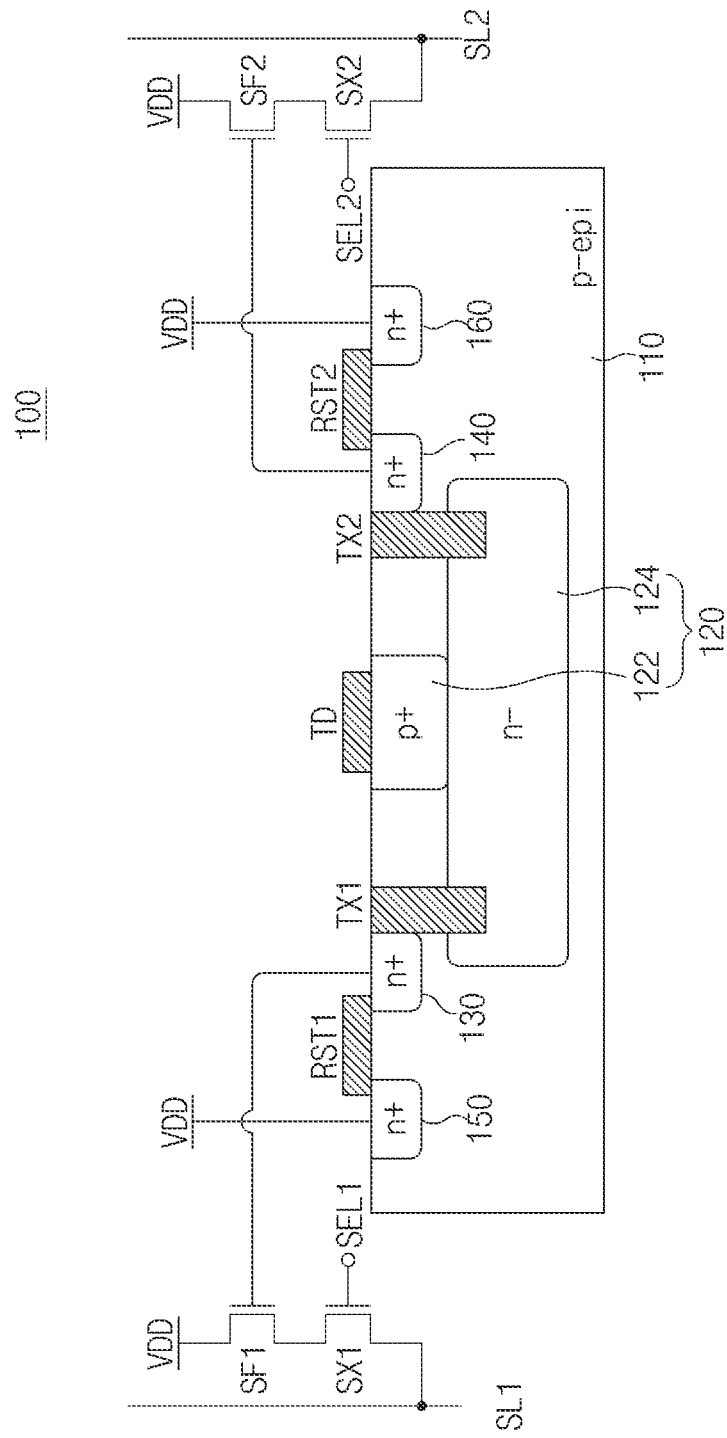
FIG. 2A is a schematic diagram illustrating an example of a pixel shown in FIG. 1 based on some implementations of the disclosed technology.

FIG. 2A is a schematic diagram illustrating an example of a pixel shown in FIG. 1 based on some implementations of the disclosed technology.

Specifically, FIG. 2A illustrates a pixel 100 that may be one of pixels (PXs) included in the pixel array 30 shown in FIG. 1.

The pixel 100 may include a single photoelectric conversion element 120, and may include two sensing circuits that can produce electrical signals by sensing and amplifying photocharges generated at different time points to output the electrical signals to the corresponding column lines. That is, the pixel 100 may include a first sensing circuit and a second sensing circuit. The first sensing circuit may include a first transfer transistor, a first reset transistor, a first source follower, and a first selection transistor. Likewise, the second sensing circuit may include a second transfer transistor, a second reset transistor, a second source follower, and a second selection transistor.

The pixel 100 may include a substrate 110, a photoelectric conversion element 120, first and second floating diffusion (FD) nodes 130 and 140, first and second drain nodes 150 and 160, a photoelectric conversion element gate (TD), first and second transfer gates TX1 and TX2, first and second reset gates RST1 and RST2, first and second source followers SF1 and SF2, and first and second selection transistors SX1 and SX2. The pixel 100 shown in FIG. 2A is merely an example, and some parts of the pixel 100 may be omitted or added as needed.

The first transfer transistor and the first reset transistor included in the first sensing circuit may be implemented as the first transfer gate TX1 and the first reset gate RST1, respectively. The first source follower and the first selection transistor may be implemented as the first source follower SF1 and the first selection transistor SX1, respectively. The transfer transistor and the reset transistor included in the second sensing circuit may be implemented as the second transfer gate TX2 and the second reset gate RST2, respectively. The second source follower and the second selection transistor may be implemented as the second source follower SF2 and the second selection transistor SX2, respectively.

The substrate 110 may include a front side (or top surface) and a back side (or bottom surface). The pixel 100 may have a backside illumination (BSI) structure that receives incident light through the back side or the bottom surface of the substrate 110, and may include a frontside illumination (FSI) structure that receives incident light through the front side or the top surface of the substrate 110.

The substrate 110 may include a P-type epitaxial (p-epi) layer. The substrate 110 may include a photoelectric conversion element 120, floating diffusion (FD) nodes 130 and 140, drain nodes 150 and 160, which are layers that are doped with impurities in the substrate 110.

The photoelectric conversion element 120 may absorb incident light and generate photocharges corresponding to the amount of absorbed incident light rays or the intensity of the light. The generated photocharges are accumulated therein. In some implementations, the photoelectric conversion element 120 may be implemented as a pinned photodiode (PPD), and may include a pinning layer 122, and a photoelectric conversion layer 124.

The pinning layer 122 may include a region that is doped with Pt-type impurities along the surface of the substrate 110. The pinning layer 122 may be used to suppress some dark current mechanisms.

The photoelectric conversion layer 124 may include a region that is doped with N⁻-type impurities and may be disposed below the pinning layer 122. The photocharges corresponding to the amount of incident light rays or the intensity of the light are generated and accumulated in the photoelectric conversion layer 124.

Referring to FIG. 2A, the photoelectric conversion layer 124 may extend in a horizontal direction such that the photoelectric conversion layer 124 is larger in width than the pinning layer 122. At least a portion of one side of the photoelectric conversion layer 124 may vertically overlap with the first floating diffusion (FD) node 130, and at least a portion of the other side of the photoelectric conversion layer 124 may vertically overlap with the second floating diffusion (FD) node 140. The photoelectric conversion layer 124 and the floating diffusion (FD) nodes 130 and 140 are formed at different depths in the substrate. As a result, the photoelectric conversion layer 124 can be formed across as large a region as possible to produce sufficient amount of photocharges. In addition, since the photoelectric conversion layer 124 can be formed near a back side (e.g., a bottom surface shown in FIG. 2A) of the substrate 110, the photoelectric conversion layer 124 can effectively receive or absorb light that is incident upon the substrate 110, resulting in a higher photoelectric conversion efficiency.

Each of the first and second floating diffusion (FD) nodes 130 and 140 may include a region that is doped with N⁺-type impurities. The first floating diffusion (FD) node 130 may accumulate photocharges received from the photoelectric conversion element 120 through the first transfer transistor, and the second floating diffusion (FD) node 140 may accumulate photocharges received from the photoelectric conversion element 120 through the second transfer transistor. The first floating diffusion (FD) node 130 may be spaced apart from the photoelectric conversion element 120 by a predetermined distance in one direction, and the second floating diffusion (FD) node 140 may be spaced apart from the photoelectric conversion element 120 by a predetermined distance in another direction. In addition, the first floating diffusion (FD) node 130 may be disposed at one side of the first transfer gate TX1, and the second floating diffusion (FD) node 140 may be disposed at one side of the second transfer gate TX2.

Each of the first and second drain nodes 150 and 160 may include a region that is doped with N⁺-type impurities. The first drain node 150 may receive photocharges from the first floating diffusion (FD) node 130 through the first reset transistor, and may drain the received photocharges to a power-supply voltage (VDD) terminal. The second drain node 160 may receive photocharges from the second floating diffusion (FD) node 140 through the second reset transistor, and may drain the received photocharges to the power-supply voltage (VDD) terminal. The first drain node 150 may be spaced apart from the first floating diffusion (FD) node 130 by a predetermined distance, and may be electrically coupled to the power-supply voltage (VDD) terminal. The second drain node 160 may be spaced apart from the second floating diffusion (FD) node 140 by a predetermined distance, and may be electrically coupled to the power-supply voltage (VDD) terminal.

The photoelectric conversion element gate TD may be disposed between the first transfer gate TX1 and the second transfer gate TX2 at an upper portion of a region corresponding to the center of the photoelectric conversion element 120, may receive a photoelectric conversion signal and control a voltage of a lower portion of the photoelectric conversion element gate TD based on the received photoelectric conversion signal. In this case, the photoelectric conversion element gate TD may provide a voltage gradient along which photocharges generated and accumulated in the photoelectric conversion layer 124 can be effectively transferred to the first transfer gate TX1 and the second transfer gate TX2.

The first transfer gate TX1 may be formed in a recess gate shape vertically extending from the front surface (i.e., the top surface of FIG. 2A) of the substrate 110 to the inside of the substrate 110. At least a portion of the first transfer gate TX1 may be inserted into the photoelectric conversion layer 124. Therefore, an upper side of the first transfer gate TX1 may be in contact with the first floating diffusion (FD) node 130, and a lower side of the first transfer gate TX1 may be in contact with the photoelectric conversion layer 124. A channel for photocharge transfer between the photoelectric conversion layer 124 and the first floating diffusion (FD) node 130 may be formed between a region in which the first transfer gate TX1 is in contact with the first floating diffusion (FD) node 130 and the other region in which the first transfer gate TX1 is in contact with the photoelectric conversion layer 124.

The first transfer gate TX1 may receive a first transmission (Tx) signal, and may thus turn on or off the first transfer transistor based on the received first transmission (Tx) signal. When the first transfer transistor is turned on, a channel is formed in the region between the photoelectric conversion element 120 and the first floating diffusion (FD) node 130, such that photocharges accumulated in the photoelectric conversion element 120 can be transferred to the first floating diffusion (FD) node 130. In contrast, when the first transfer transistor is turned off, a channel is not formed in the region between the photoelectric conversion element 120 and the first floating diffusion (FD) node 130, such that such photocharge transfer may not occur between the photoelectric conversion element 120 and the first floating diffusion (FD) node 130.

Further, while the first transfer transistor is turned on, a voltage level of the first transmission (Tx) signal applied to the first transfer gate TX1 may determine a photocharge collection capability of the first transfer gate TX1. When a voltage (hereinafter referred to as an activation voltage) is applied to turn on the first transfer gate TX1 of the first transfer transistor, the first transfer gate TX1 may have a photocharge collection capability for collecting, at an area near the surface of the first transfer gate TX1, photocharges that are generated by and present in the photoelectric conversion layer 124. The collected photocharges are transferred to the first floating diffusion (FD) node 130 through a channel. The photocharge collection capability may increase in proportion to the voltage level of the first transmission (Tx) signal. In some implementations, the voltage level of the first transmission (Tx) signal may adjust the amount of the photocharges that are transferred through the first transfer gate TX1.

The second transfer gate TX2 may be formed in a recess gate shape vertically extending from the front surface (i.e., the top surface of FIG. 2A) of the substrate 110 to the inside of the substrate 110. At least a portion of the second transfer gate TX2 may be inserted into the photoelectric conversion layer 124. Therefore, an upper side of the second transfer gate TX2 may be in contact with the second floating diffusion (FD) node 140, and a lower side of the second transfer gate TX2 may be in contact with the photoelectric conversion layer 124. A channel for photocharge transfer between the photoelectric conversion layer 124 and the second floating diffusion (FD) node 140 may be disposed between a region in which the second transfer gate TX2 is in contact with the second floating diffusion (FD) node 140 and the other region in which the second transfer gate TX2 is in contact with the photoelectric conversion layer 124.

The second transfer gate TX2 may receive a second transmission (Tx) signal, and may thus turn on or off the second transfer transistor based on the received second transmission (Tx) signal. When the second transfer transistor is turned on, a channel is formed in the region between the photoelectric conversion element 120 and the second floating diffusion (FD) node 140, such that photocharges accumulated in the photoelectric conversion element 120 can be transferred to the second floating diffusion (FD) node 140. In contrast, when the first transfer transistor is turned off, a channel is not formed in the region between the photoelectric conversion element 120 and the second floating diffusion (FD) node 140, such that such photocharge transfer may not occur between the photoelectric conversion element 120 and the second floating diffusion (FD) node 140.

Further, while the second transfer transistor is turned on, a voltage level of the second transmission (Tx) signal applied to the second transfer gate TX2 may determine a photocharge collection capability of the second transfer gate TX2. When an activation voltage is applied to turn on the second transfer gate TX2 of the second transfer transistor, the second transfer gate TX2 may have a photocharge collection capability for collecting, at an area near the surface of the second transfer gate TX2, photocharges that are generated by and present in the photoelectric conversion layer 124. The collected photocharges are transferred to the second floating diffusion (FD) node 140 through a channel. The photocharge collection capability may increase in proportion to the voltage level of the second transmission (Tx) signal. In some implementations, the voltage level of the second transmission (Tx) signal may adjust the amount of the photocharge that are transferred through the second transfer gate TX2.

Since at least a portion of the first reset gate RST1 may overlap with the first floating diffusion (FD) node 130 and the first drain node 150, the first reset gate RST1 may be disposed over a region between the first floating diffusion (FD) node 130 and the first drain node 150. The first reset gate RST1 may receive a first reset signal, and may turn on or off the first reset transistor based on the first reset signal. When the first reset transistor is turned on, a channel may be formed in the region between the first floating diffusion (FD) node 130 and the first drain node 150, such that photocharges accumulated in the first floating diffusion (FD) node 130 can be transferred to the first drain node 150 through the channel. In contrast, when the first reset transistor is turned off, a channel may not be formed in the region between the first floating diffusion (FD) node 130 and the first drain node 150, such that photocharge transfer may not occur between the first floating diffusion (FD) node 130 and the first drain node 150.

Since at least a portion of the second reset gate RST2 may overlap with the second floating diffusion (FD) node 140 and the second drain node 160, the second reset gate RST2 may be disposed over a region between the second floating diffusion (FD) node 140 and the second drain node 160. The second reset gate RST2 may receive a second reset signal, and may turn on or off the second reset transistor based on the second reset signal. When the second reset transistor is turned on, a channel may be formed in the region between the second floating diffusion (FD) node 140 and the second drain node 160, such that photocharges accumulated in the second floating diffusion (FD) node 140 can be transferred to the second drain node 160. In contrast, when the second reset transistor is turned off, a channel may not be formed in the region between the second floating diffusion (FD) node 140 and the second drain node 160, such that photocharge transfer may not occur between the second floating diffusion (FD) node 140 and the second drain node 160.

Each of the first transfer gate TX1, the second transfer gate TX2, the first reset gate RST1, and the second reset gate RST2 may have a dual structure including a gate insulation layer and a gate electrode.

In this case, the gate insulation layer may be disposed between the substrate 110 and the gate electrode, such that the gate insulation layer may electrically isolate the gate electrode. Although the gate insulation layer may be implemented as an oxide layer, the scope or spirit of the disclosed technology is not limited thereto.

The gate electrode may receive a signal (e.g., a first transmission (Tx) signal, a second transmission (Tx) signal, etc.) that is applied to a corresponding gate, such that the gate electrode can control a voltage of a lower portion of the corresponding gate using the received signal. By way of example only, the gate electrode may be formed of polysilicon or other similar materials.

Since a gate of the first source follower SF1 is coupled to the first floating diffusion (FD) node 130 and the first source follower SF1 is coupled between the power-supply voltage (VDD) terminal and the first selection transistor SX1, the first source follower SF1 may amplify a voltage change at the first floating diffusion (FD) node 130 and may transfer the amplified voltage to the first selection transistor SX1.

Since a gate of the second source follower SF2 is coupled to the second floating diffusion (FD) node 140 and the second source follower SF2 is coupled between the power-supply voltage (VDD) terminal and the second selection transistor SX2, the second source follower SF2 may amplify a change in voltage of the second floating diffusion (FD) node 140 and may transfer the amplified voltage to the second selection transistor SX2.

The first selection transistor SX1 may receive a first selection signal SEL1 through a gate terminal thereof, may be coupled between the first source follower SF1 and a first column line SL1, and may be turned on by the first selection signal SEL1, such that the first selection transistor SX1 may output a signal corresponding to the voltage change at the first floating diffusion (FD) node 130 received from the first source follower SF1 to the first column line SL1.

The second selection transistor SX2 may receive a second selection signal SEL2 through a gate terminal thereof, may be coupled between the second source follower SF2 and a second column line SL2, and may be turned on by the second selection signal SEL2, such that the second selection transistor SX2 may output a signal corresponding to the voltage change at the second floating diffusion (FD) node 140 received from the second source follower SF2 to the second column line SL2.

The pixel 100 may output photocharges generated during a first time section or first period to the first column line SL1 through the first sensing circuit, and may output photocharges generated during a second time section or second period to the second column line SL2 through the second sensing circuit. Here, the first period and the second period may be continuous periods of time (i.e., consecutive time sections or periods). To this end, the first transfer transistor may be turned on in the first period, and may be turned off in the second period. The second transfer transistor may be turned off in the first period, and may be turned on in the second period. That is, the first transmission (Tx) signal and the second transmission (Tx) signal may be opposite in phase to each other. The first transfer gate TX1 may receive the first transmission (Tx) signal as an input control signal to control the charge transfer operation of the first transfer gate TX1, such that the first transfer gate TX1 may transfer, in response to the first transmission signal, photocharges generated in the first period to the first floating diffusion (FD) node 130. The second transfer gate TX2 may receive the second transmission (Tx) signal as an input control signal to control the charge transfer operation of the second transfer gate TX2, such that the second transfer gate TX2 may transfer, in response to the second transmission signal, photocharges generated in the second period to the second floating diffusion (FD) node 140. In this case, each of the first transmission (Tx) signal and the second transmission (Tx) signal may have a specific phase difference (e.g., 0°, 90°, 180°, 270°, etc.) with respect to the modulated light signal MLS that drives the light source 10.

In implementations, all pixels included in the pixel array 30 may operate in a global shutter mode in which the pixels of the pixel array 30 may simultaneously capture photocharges generated in the first period through the first transfer transistor and may simultaneously capture photocharges generated in the second period through the second transfer transistor, such that the captured photocharges can be sequentially output through the first column line SL1 and the second column line SL2 on a row basis of the pixel array 30.

Figure 2B:
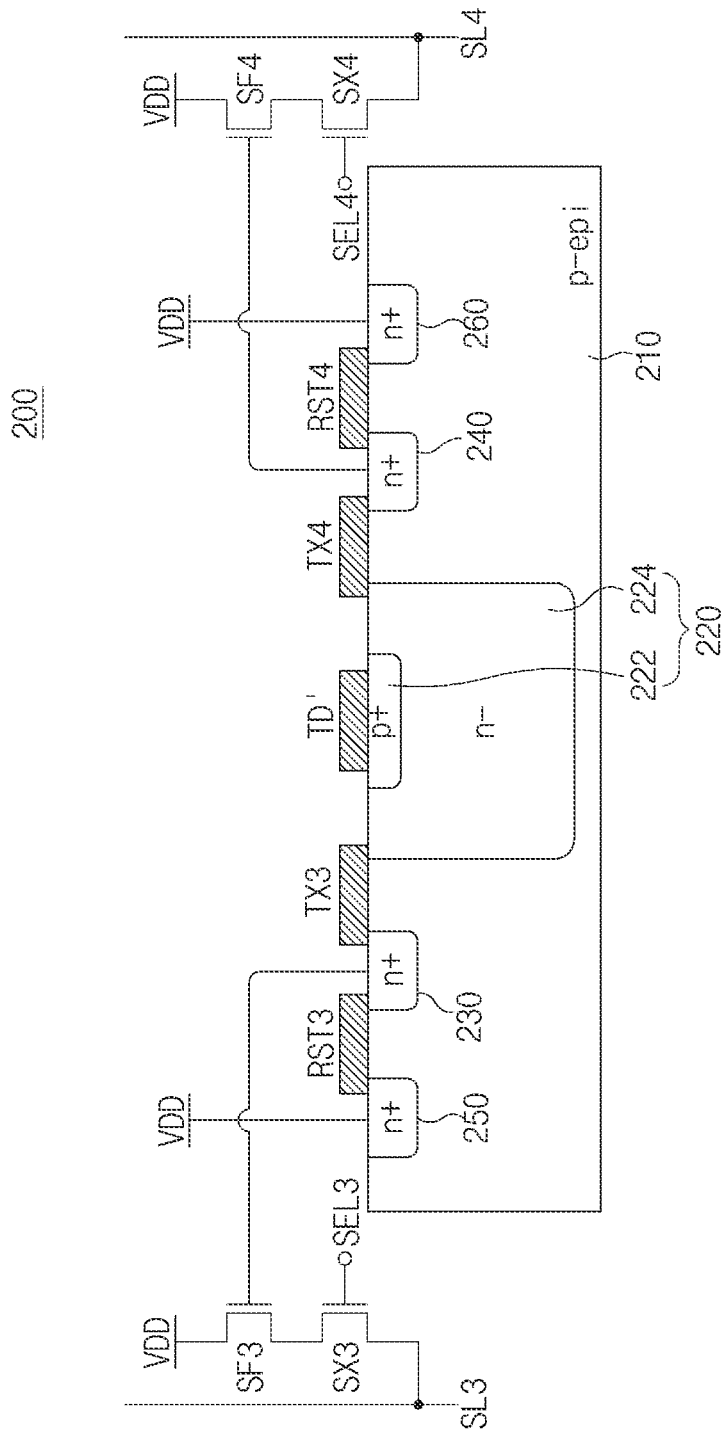
FIG. 2B is a schematic diagram illustrating an example of a pixel shown in FIG. 1 based on some implementations of the disclosed technology.

FIG. 2B is a schematic diagram illustrating an example of the pixel shown in FIG. 1 based on some implementations of the disclosed technology.

Specifically, FIG. 2B illustrates a pixel 200 that may be one of pixels (PXs) included in the pixel array 30 shown in FIG. 1.

The pixel 200 may include a substrate 210, a photoelectric conversion element 220, third and fourth floating diffusion (FD) nodes 230 and 240, third and fourth drain nodes 250 and 260, a photoelectric conversion element gate (TD'), third and fourth transfer gates TX3 and TX4, third and fourth reset gates RST3 and RST4, third and fourth source followers SF3 and SF4, and third and fourth selection transistors SX3 and SX4. The remaining components of the pixel 200 may be similar or identical to those of the pixel 100 shown in FIG. 2A.

In some implementations, a top surface of a photoelectric conversion layer 224 of the photoelectric conversion element 220 is not spaced apart from a top surface of the substrate 210, and may be disposed along the top surface of the substrate 210 while simultaneously surrounding a pinning layer 222.

In some implementations, the third transfer gate TX3 is not formed within the substrate 210, and may be disposed over the substrate 210 in the same manner as in the third reset gate RST3. In a situation in which at least a portion of the third transfer gate TX3 overlaps with the photoelectric conversion element 220 and the third floating diffusion (FD) node 230, the third transfer gate TX3 may be disposed over a region between the photoelectric conversion element 220 and the third floating diffusion (FD) node 230. Therefore, a channel for photocharge transfer between the photoelectric conversion layer 224 and the third floating diffusion (FD) node 230 may be formed between a region in which the third transfer gate TX3 is in contact with the third floating diffusion (FD) node 230 and the other region in which the third transfer gate TX3 is in contact with the photoelectric conversion layer 224.

In some implementations, the fourth transfer gate TX4 is not formed within the substrate 210, and may be disposed over the substrate 210 in the same manner as in the fourth reset gate RST4. In a situation in which at least a portion of the fourth transfer gate TX4 overlaps with the photoelectric conversion element 220 and the fourth floating diffusion (FD) node 240, the fourth transfer gate TX4 may be disposed over a region between the photoelectric conversion element 220 and the fourth floating diffusion (FD) node 240. Therefore, a channel for photocharge transfer between the photoelectric conversion layer 224 and the fourth floating diffusion (FD) node 240 may be formed between a region in which the fourth transfer gate TX4 is in contact with the fourth floating diffusion (FD) node 240 and the other region in which the fourth transfer gate TX4 is in contact with the photoelectric conversion layer 224.

In other words, each of the third transfer gate TX3 and the fourth transfer gate TX4 may be formed in a planar gate by extending along a top surface (or a front surface) of the substrate 210. The third transfer gate TX3 may be referred to as the first transfer gate included in the first transfer transistor, and the fourth transfer gate TX4 may be referred to as the second transfer gate included in the second transfer transistor.

Figure 3:
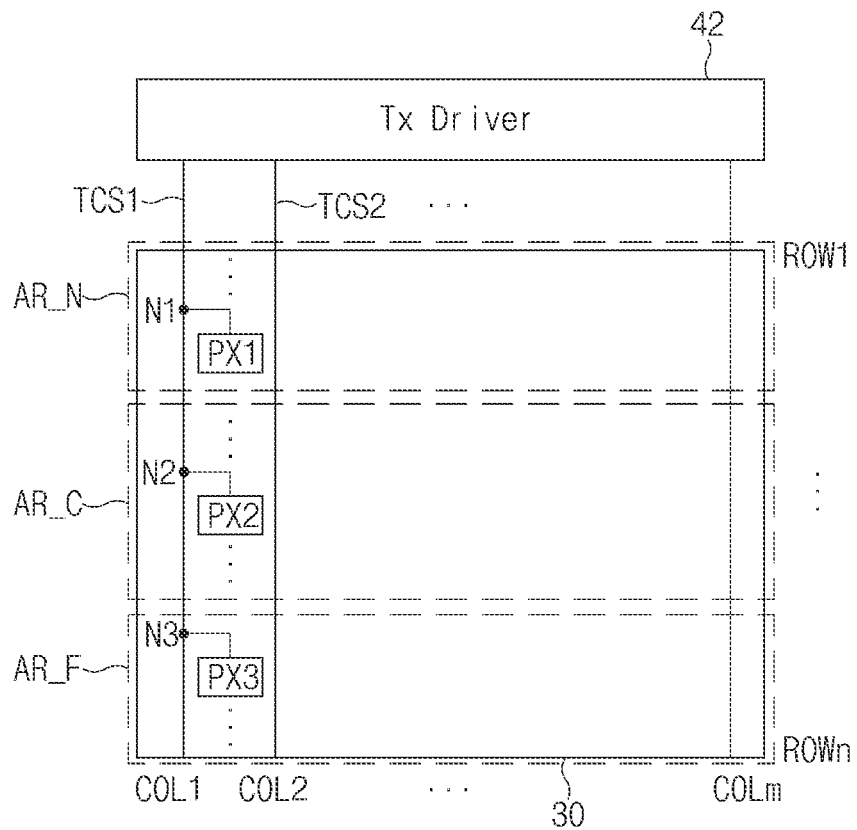
FIG. 3 is a schematic diagram illustrating an example of a pixel array and a transmission (Tx) driver shown in FIG. 1 based on some implementations of the disclosed technology.

FIG. 3 is a schematic diagram illustrating an example of the pixel array 30 and the transmission (Tx) driver 42 shown in FIG. 1 based on some implementations of the disclosed technology.

Referring to FIG. 3, the pixel array 30 may include a plurality of pixels arranged in a matrix including N rows ROW1-ROWn (where n is an integer identical to or greater than 2) and M columns COL1-COLm (where m is an integer identical to or greater than 2).

The transmission (Tx) driver 42 may provide transmission (Tx) signals to M columns of the pixel array 30 through first to M-th transmission (Tx) signal lines TCS1-TCSm, respectively. Each of the first to M-th transmission (Tx) signal lines TCS1-TCSm may be mapped to each of M columns of the pixel array 30. Image sensor pixels belonging to the same column of the pixel array 30 may receive transmission (Tx) signals through the same transmission (Tx) signal line. Although FIG. 3 illustrates that each of the first to M-th transmission (Tx) signal lines TCS1-TCSm include one signal line, the scope or spirit of the disclosed technology is not limited thereto, and each of the first to M-th transmission (Tx) signal lines TCS1-TCSm may include more than one signal line. In some implementations, each of the first to M-th transmission (Tx) signal lines TCS1-TCSm may include a signal line (e.g., a first sub transmission (Tx) signal line) for applying the first transmission (Tx) signal to be input to the first transfer gate TX1 or the third transfer gate TX3, and may include a signal line (e.g., a second sub transmission (Tx) signal line) for applying the second transmission (Tx) signal to be input to the second transfer gate TX2 or the fourth transfer gate TX4. For example, pixels belonging to the first column COL1 may receive the first and second transmission (Tx) signals through the first transmission (Tx) signal line TCS1.

In some implementations, the pixel array 30 may include a central region AR_C, a near-field region AR_N, and a far-field region AR_F. The central region AR_C, the near-field region AR_N, and the far-field region AR_F may be consecutive regions. The near-field region AR_N may denote a region where a signal transmission distance to the transmission (Tx) driver 42 is relatively short. The far-field region AR_F may denote a region where a signal transmission distance to the transmission (Tx) driver 42 is relatively long. The central region AR_C may denote an intermediate region between the near-field region AR_N and the far-field region AR_F. Therefore, the signal transmission distance to the transmission (Tx) driver 42 from the far-field region AR_F is longer than that from the central region AR_C or from the near-field region AR_N, and the signal transmission distance to the transmission (Tx) driver 42 from the central region AR_C is longer than that from the near-field region AR_N.

The central region AR_C may include a predetermined number of rows including a row, e.g., ROWk (where 'k' is 'n/2' or an integer closest to 'n/2'), corresponding to the middle of rows ROW1-ROWn of the pixel array 30. The central region AR_C may include a second pixel PX2 belonging to the first column COL1. The second pixel PX2 may be coupled to the first transmission (Tx) signal line TCS1 through a second node N2.

The near-field region AR_N may be disposed between the central region AR_C and the transmission (Tx) driver 42 or may be disposed over the central region AR_C. The near-field region AR_N may include a predetermined number of rows including the first row ROW1. The near-field region AR_N may include the first pixel PX1 belonging to the first column COL1. The first pixel PX1 may be coupled to the first transmission (Tx) signal line TCS1 through a first node N1.

The far-field region AR_F may be a region that is disposed in the direction opposite to that of the transmission (Tx) driver 42 with respect to the central region AR_C, or may be disposed below the central region AR_C. The far-field region AR_F may include a predetermined number of rows including the N-th row (ROWn). The far-field region AR_F may include a third pixel PX3 belonging to the first column COL1. The third pixel PX3 may be coupled to the first transmission (Tx) signal line TCS1 through a third node N3.

The number of rows included in the central region AR_C, the number of rows included in the near-field region AR_N, and the number of rows included in the far-field region AR_F may be identical to or different from each other.

The distance between the transmission (Tx) driver 42 and the near-field region AR_N, the distance between the transmission (Tx) driver 42 and the central region AR_C, and the distance between the transmission (Tx) driver 42 and the far-field region AR_F may sequentially increase.

In some implementations of the disclosed technology, the pixel included in the central region AR_C, the pixel included in the near-field region AR_N, and the pixel included in the far-field region AR_F may be different from each other in terms of a pixel structure (e.g., a structure of the first and second transfer gates). The above-mentioned structure changeable depending on the position of each pixel will be described later with reference to FIGS. 5 to 10.

Although in some implementations of the disclosed technology the transmission (Tx) driver 42 is disposed at an upper side of the pixel array 30, the transmission (Tx) driver 42 can also be disposed at the left or right side of the pixel array 30 as illustrated in FIG. 3. For example, when the transmission (Tx) driver 42 is disposed at the left side of the pixel array 30, the pixel array 30 may be divided into three consecutive regions (e.g., the central region AR_C that is vertically elongated, the near-field region AR_N disposed at the left side of the central region, and the far-field region AR_F disposed at the right side of the central region) arranged in a horizontal direction.

Figure 4:
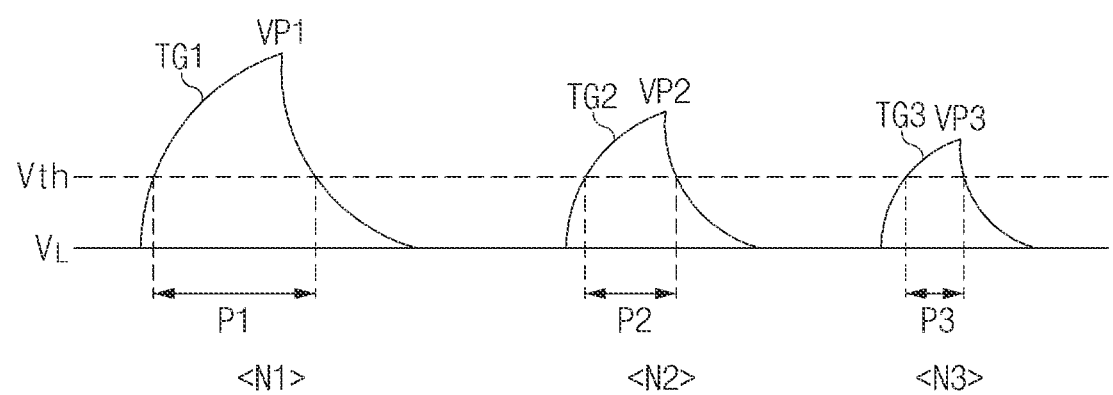
FIG. 4 illustrates waveforms of transmission (Tx) signals measured at respective nodes shown in FIG. 3 based on some implementations of the disclosed technology.

FIG. 4 illustrates waveforms of transmission (Tx) signals measured at the respective nodes shown in FIG. 3 based on some implementations of the disclosed technology.

Referring to FIG. 4, waveforms of the transmission (Tx) signals measured at the respective nodes N1, N2, and N3 are illustrated. Each of the waveforms may denote one pulse signal needed to turn on the corresponding transfer gate.

For convenience of description, the transmission (Tx) signal applied to the first node N1 will hereinafter be referred to as a first input transmission (Tx) signal TG1, the transmission (Tx) signal applied to the second node N2 will hereinafter be referred to as a second input transmission (Tx) signal TG2, and the transmission (Tx) signal applied to the third node N3 will hereinafter be referred to as a third input transmission (Tx) signal TG3. Each of the first to third input transmission (Tx) signals TG1-TG3 may be any one of the first transmission (Tx) signal and the second transmission (Tx) signal.

In some implementations of the disclosed technology, it is assumed that the first input transmission (Tx) signal TG1 has the same waveforms as those of any one of the first transmission (Tx) signal and the second transmission (Tx) signal that are output from the transmission (Tx) driver 42.

Each of the first to third input transmission (Tx) signals TG1-TG3 may denote one pulse signal needed to turn on the corresponding transfer gate. In order to turn on or off the corresponding transfer gate at a desired time, it may be preferable that a pulse waveform of square waves be used. However, as can be seen from FIG. 4, actual signal waveforms generated by and/or output from the transmission (Tx)

driver 42 may exponentially increase from a base voltage ($V_L$) or may exponentially decrease from the base voltage ($V_L$), such that the resultant signal waveforms may reach the base voltage ($V_L$) and may be similar in shape to sawtooth pulse waveforms. In this case, the base voltage ($V_L$) may denote a voltage in a situation in which no pulse is applied to the first to third input transmission (Tx) signals TG1-TG3. For example, the base voltage ($V_L$) may be a ground voltage.

A threshold voltage ($V_{th}$) may denote a threshold voltage for turning on or off the corresponding transfer transistor. The corresponding transfer transistor may be turned on in a time period in which each of the first to third input transmission (Tx) signals TG1-TG3 has a higher voltage than the threshold voltage ($V_{th}$), and may be turned off in a time period in which each of the first to third input transmission (Tx) signals TG1-TG3 has a lower voltage than the threshold voltage ($V_{th}$).

First, the first input transmission (Tx) signal TG1 may have a first peak voltage VP1 and a first activation time P1. Here, the first peak voltage VP1 may denote a maximum voltage within one pulse cycle of the first input transmission (Tx) signal TG1, and the first activation time P1 may denote a specific time in which the corresponding transfer transistor is turned on within one pulse cycle of the first input transmission (Tx) signal TG1.

The second input transmission (Tx) signal TG2 may have a second peak voltage VP2 and a second activation time P2. Here, the second peak voltage VP2 may be lower than the first peak voltage VP1, and the second activation time P2 may be shorter than the first activation time P1.

In addition, the third input transmission (Tx) signal TG3 may have a third peak voltage VP3 and a third activation time P3. The third peak voltage VP3 may be lower than the second peak voltage VP2, and the third activation time P3 may be shorter than the second activation time P2.

The first transmission (Tx) signal line TCS1 may include a metal line and such a metal line and the pixels coupled to the first transmission (Tx) signal line TCS1 may act as resistors to cause an IR drop. As the distance from each pixel to the transmission (Tx) driver 42 increases, the metal line may increase in length and the number of pixels disposed between the corresponding pixel and the transmission (Tx) driver 42 may also increase. As a result, the voltage of the first transmission (Tx) signal and the voltage of the second transmission (Tx) signal that are applied to the corresponding pixel can be reduced as a whole as the distance between the corresponding pixel and the transmission (Tx) driver 42 increases. The above-mentioned phenomenon can be defined as a shading phenomenon for the first transmission (Tx) signal and the second transmission (Tx) signal.

In other words, the voltage of the second input transmission (Tx) signal TG2 applied to the second pixel PX2 included in the central region AR_C may be lower than the voltage of the first input transmission (Tx) signal TG1 applied to the first pixel PX1 included in the near-field region AR_N. In addition, the voltage of the third input transmission (Tx) signal TG3 applied to the third pixel PX3 included in the far-field region AR_F may lower than the voltage of the second input transmission (Tx) signal TG2 applied to the second pixel PX2 included in the central region AR_C.

Accordingly, the peak voltage may sequentially decrease in the direction from the first input transmission (Tx) signal TG1 to the third input transmission (Tx) signal TG3. The peak voltage may determine photocharge collection capability of the corresponding transfer gate. As the distance from the pixel to the transmission (Tx) driver 42 increases, the peak voltage of each of the first and second transmission (Tx) signal may decrease, resulting in deterioration in the photocharge collection capability of the first and second transfer gates.

In addition, the activation time may sequentially decrease in the direction from the first input transmission (Tx) signal TG1 to the third input transmission (Tx) signal TG3. Here, the activation time may refer to a time period in which a channel is formed between the photoelectric conversion element and the floating diffusion (FD) node. As the distance from the pixel to the transmission (Tx) driver 42 increases, the activation time of each of the first and second transmission (Tx) signals may decrease, resulting in reduction in photocharge transfer capability of the first and second transfer gates.

In the ideal case, all photocharges generated in the first period should be transferred to the first floating diffusion (FD) node (or the third floating diffusion (FD) node) through the first transfer gate (or the third transfer gate), and all photocharges generated in the second period should be transferred to the second floating diffusion (FD) node (or the fourth floating diffusion (FD) node) through the second transfer gate (or the fourth transfer gate).

However, as the distance between the pixel and the transmission (Tx) driver 42 increases, the photocharge collection capability and the photocharge transfer capability may be degraded, such that photocharges generated in each period may remain in the photoelectric conversion element without being completely transferred to the corresponding floating diffusion (FD) node. The remaining photocharges may act as noise to cause a depth error, such that an image quality may be degraded or calibration of an image processor may be additionally required, decreasing the operation speed of the image processor.

However, in some implementations of the disclosed technology, the ability to transfer the photocharges from the photoelectric conversion element and the floating diffusion (FD) node may be the same, regardless of how far the pixels are spaced from the transmission (Tx) driver. As a result, when uniform light is incident upon the entire pixel array 30, the intensity of a pixel signal generated from the corresponding pixel will be the same regardless of the distance between the pixel and the transmission (Tx) driver 42.

As described above, the pixel signal may be uniformly generated from the entire pixel array 30 in response to the uniform light signal without noise caused by IR drop, such that the number of errors in a process of calculating the distance to a target object 1 can be minimized due to the improved demodulation contrast.

The above-mentioned photocharge collection capability and the photocharge transfer capability may be used as elements which determine photocharge transmission (Tx) efficiency indicating how much photocharges generated by the photoelectric conversion element can be transferred to the corresponding floating diffusion (FD) node. In more detail, as the photocharge collection capability and/or the photocharge transfer capability increases, the photocharge transmission (Tx) efficiency may also increase.

Figure 5:
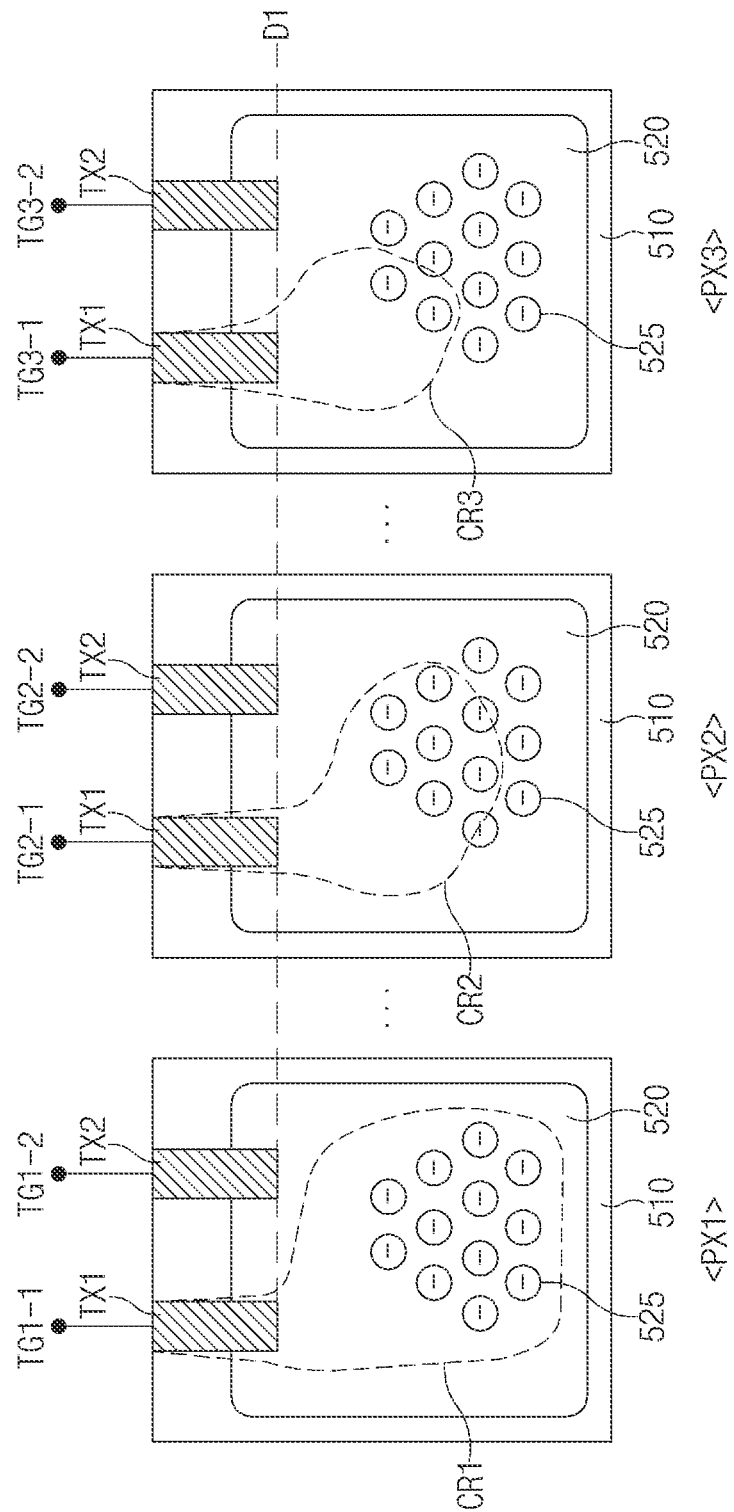
FIG. 5 is a schematic diagram illustrating an example of a pixel array.

FIG. 5 is a schematic diagram illustrating the first pixel PX1, the second pixel PX2, and the third pixel PX3. It should be noted that FIG. 5 briefly illustrates only a substrate 510, a photoelectric conversion layer 520, a first transfer gate TX1, and a second transfer gate TX2, among other constituent elements of the first to third pixels PX1-PX3. Each of the first to third pixels PX1-PX3 shown in FIG. 5 may have a structure and operation corresponding to the pixel 100 shown in FIG. 2A.

In FIG. 5, it is assumed that each of the first to third pixels PX1-PX3 performs operations corresponding to the first period for convenience of description and better understanding of the disclosed technology.

The photoelectric conversion layer 520 formed in the substrate 510 in each of the first to third pixels PX1-PX3 may generate and accumulate photocharges 525 corresponding to the amount of incident light rays or the intensity of the light. In FIG. 5, it is assumed that each of the first to third pixels PX1-PX3 generates the same amount of photocharges 525.

In addition, the first and second transfer gates TX1 and TX2 included in each of the first to third pixels PX1-PX3 may have the same first depth D1. Here, the depth of the first transfer gate TX1 may refer to the length from a top surface of the first transfer gate TX1 to a bottom surface of the first transfer gate TX1, and the depth of the second transfer gate TX2 may refer to the length from a top surface of the second transfer gate TX2 to a bottom surface of the second transfer gate TX2.

The first transfer gate TX1 of the first pixel PX1 may receive a first input transmission (Tx) signal TG1-1, and the second transfer gate TX2 of the first pixel PX1 may receive a first input transmission (Tx) signal TG1-2. The first input transmission (Tx) signal TG1-1 and the first input transmission (Tx) signal TG1-2 may correspond to the first transmission (Tx) signal and the second transmission (Tx) signal shown in FIG. 2A, respectively.

The first transfer gate TX1 of the second pixel PX2 may receive a second input transmission (Tx) signal TG2-1, and the second transfer gate TX2 of the second pixel PX2 may receive a second input transmission (Tx) signal TG2-2. The second input transmission (Tx) signal TG2-1 and the second input transmission (Tx) signal TG2-2 may correspond to the first transmission (Tx) signal and the second transmission (Tx) signal shown in FIG. 2A, respectively.

The first transfer gate TX1 of the third pixel PX3 may receive a third input transmission (Tx) signal TG3-1, and the second transfer gate TX2 of the third pixel PX3 may receive a third input transmission (Tx) signal TG3-2. The third input transmission (Tx) signal TG3-1 and the third input transmission (Tx) signal TG3-2 may correspond to the first transmission (Tx) signal and the second transmission (Tx) signal shown in FIG. 2A, respectively.

On the other hand, in the first period, an activated input transmission (Tx) signal may be applied to the first transfer gate TX1 of each of the first to third pixels PX1-PX3. Thus, a first photocharge collection range CR1 corresponding to the corresponding input transmission (Tx) signal of the first pixel PX1, a second photocharge collection range CR2 corresponding to the corresponding input transmission (Tx) signal of the second pixel PX2, and a third photocharge collection range CR3 corresponding to the corresponding input transmission (Tx) signal of the third pixel PX3 are illustrated in FIG. 5. Here, the photocharge collection range may refer to a range in which the corresponding transfer gate can pull photocharges included in the photoelectric conversion layer 520 to the surface of the corresponding transfer gate and then transfer the photocharges to the channel. The photocharge collection range may correspond to one element capable of determining the above-mentioned photocharge collection capability.

Since the peak voltage sequentially decreases in the direction from the first input transmission (Tx) signal TG1-1 to the third input transmission (Tx) signal TG3-1, the photocharge collection range of the first transfer gate TX1 may also sequentially decrease in the direction from the first pixel PX1 to the third pixel PX3.

In the first period, the first transfer gate TX1 of the first pixel PX1 having the first photocharge collection range CR1 may transmit all of photocharges 525 shown in FIG. 5 to the first floating diffusion (FD) node. In contrast, the first transfer gate TX1 of the second pixel PX2 having the second photocharge collection range CR2 may transmit only some photocharges 525 included in the second photocharge collection range CR2 to the first floating diffusion (FD) node. In addition, the first transfer gate TX1 of the third pixel PX3 having the third photocharge collection range CR3 may transmit only some photocharges 525 included in the third photocharge collection range CR3 to the floating diffusion (FD) node.

Accordingly, in the first period, the amount of residual photocharges in the photoelectric conversion layer 520 may sequentially increase in the direction from the first pixel PX1 to the third pixel PX3, such that the amount of noise caused by IR drop may also increase.

Figure 6:
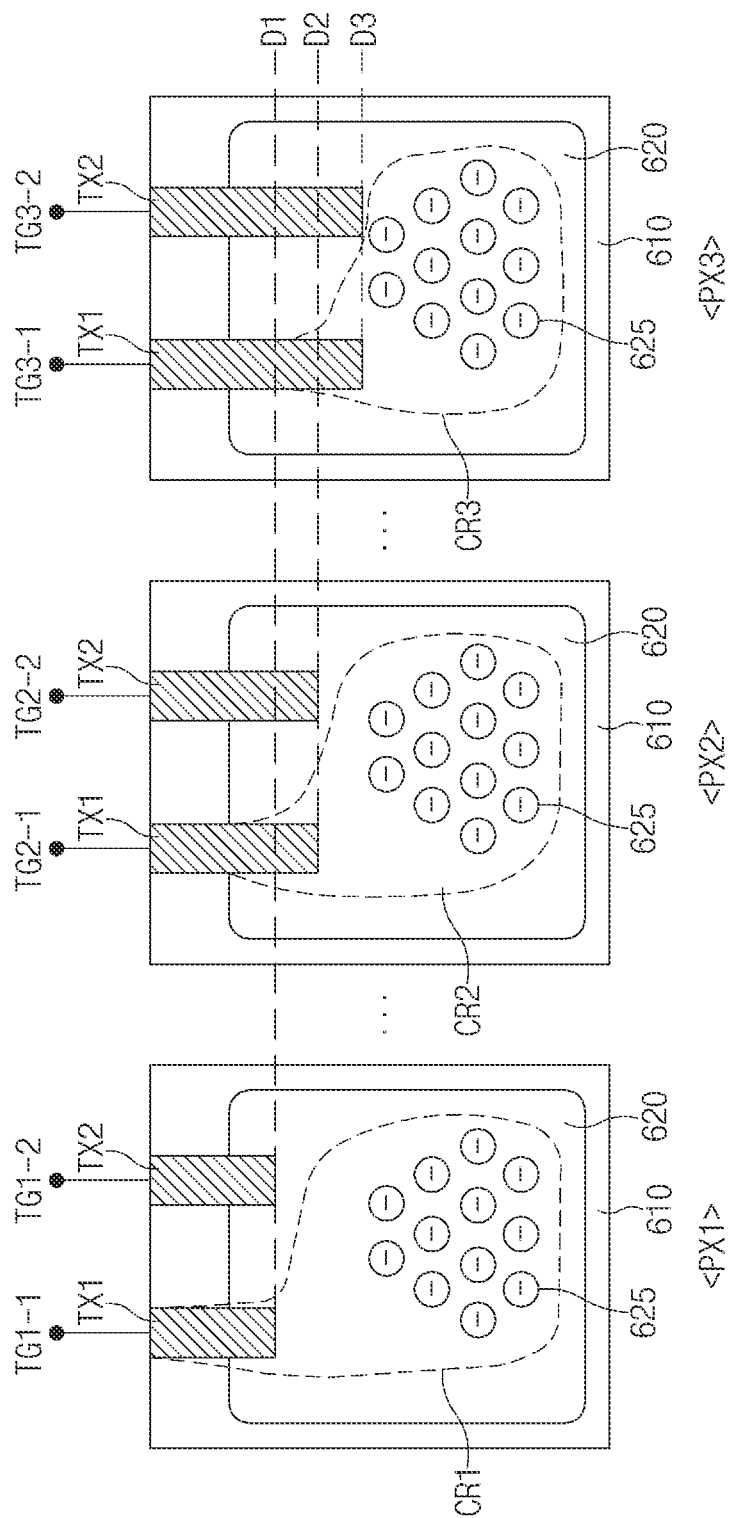
FIG. 6 is a schematic diagram illustrating an example of a pixel array based on some implementations of the disclosed technology.

FIG. 6 is a schematic diagram illustrating an example of the pixel array based on some implementations of the disclosed technology.

FIG. 6 is a structural diagram illustrating the first pixel PX1, the second pixel PX2, and the third pixel PX3 based on some implementations of the disclosed technology. FIG. 6 illustrates unique characteristics different from those of the comparative example shown in FIG. 5, and thus the discussion on the pixel array shown in FIG. 6 will focus on such characteristics different from those of the pixel array shown in FIG. 5. It should be noted that FIG. 6 briefly illustrates only a substrate 610, a photoelectric conversion layer 620, a first transfer gate TX1, and a second transfer gate TX2, among other constituent elements of each of the first to third pixels PX1-PX3. Each of the first to third pixels PX1-PX3 shown in FIG. 6 may have a structure and operation corresponding to the pixel 100 shown in FIG. 2A.

Unlike FIG. 5, each of the first and second transfer gates TX1 and TX2 included in each of the first to third pixels PX1-PX3 shown in FIG. 6 may have a first depth D1, a second depth D2, and a third depth D3 that are sequentially increasing in the direction from the first pixel PX1 to the third pixel PX3.

In the first period, an activated input transmission (Tx) signal may be applied to the first transfer gate TX1 of each of the first to third pixels PX1-PX3. Thus, a first photocharge collection range CR1 corresponding to the corresponding input transmission (Tx) signal of the first pixel PX1, a second photocharge collection range CR2 corresponding to the corresponding input transmission (Tx) signal of the second pixel PX2, and a third photocharge collection range CR3 corresponding to the corresponding input transmission (Tx) signal of the third pixel PX3 are illustrated in FIG. 6.

Since the peak voltage sequentially decreases in the direction from the first input transmission (Tx) signal TG1-1 to the third input transmission (Tx) signal TG3-1, the photocharge collection range of the first transfer gate TX1 may also sequentially decrease in the direction from the first pixel PX1 to the third pixel PX3.

However, as can be seen from the first to third pixels PX1-PX3 shown in FIG. 6, the depth of the first and second transfer gates TX1 and TX2 may sequentially increase in the direction from the first pixel PX1 to the third pixel PX3, as represented by D1 in the first pixel PX1, D2 in the second pixel PX2, and D3 in the third pixel D3, where D3 is deeper than D1 and D2, and D2 is deeper than D1. As a result, photocharges 625 can be completely included in each of the first to third photocharge collection ranges CR1-CR3, regardless of reduction in the photocharge collection range of the first transfer gate TX1. That is, although the photocharge collection range is gradually reduced in the direction from the first pixel PX1 to the third pixel PX3 in the same manner as in FIG. 5, the photocharge collection capabilities of the first to third pixels PX1-PX3 can remain similar to each other in a different way from FIG. 5.

Therefore, although a voltage drop of the first transmission (Tx) signal (or the second transmission (Tx) signal) gradually increases in the direction from the near-field region AR_N to the far-field region AR_F, the intensity of pixel signals can be kept constant (or uniform) throughout the pixel array 30 under the condition that a uniform light signal is used, such that noise caused by IR drop can be prevented from flowing into the pixel array 30.

In some implementations of the disclosed technology, the first transfer gate TX1 and the second transfer gate TX2 may be formed by repeatedly performing a trench process three times. In this case, in the first trench process from among three trench processes, in a situation in which a mask for preventing etching is not disposed in the near-field region AR_N, the central region AR_C, and the far-field region AR_F, a trench process may be carried out. In the second trench process, in a situation in which the mask is disposed in the near-field region AR_N, a trench process may be carried out. In the third trench process, in a situation in which the mask is disposed in the near-field region AR_N and the central region AR_C, a trench process may be carried out. Through the above-mentioned trench processes, the depth of each of the first and second transfer gates TX1 and TX2 included in the near-field region AR_N, the depth of each of the first and second transfer gates TX1 and TX2 included in the central region AR_C, and the depth of each of the first and second transfer gates TX1 and TX2 included in the far-field region AR_F may be different from each other. In more detail, the depth of each of the first transfer gate TX1 and the second transfer gate TX2 for each region may be changed according to the respective regions AR_N, AR_C, and AR_F.

In each of the near-field region AR_N, the central region AR_C, and the far-field region AR_F, the depth of each of the first transfer gate TX1 and the second transfer gate TX2 can be determined experimentally to implement uniform photocharge collection capability throughout the pixel array 30.

Figure 7:
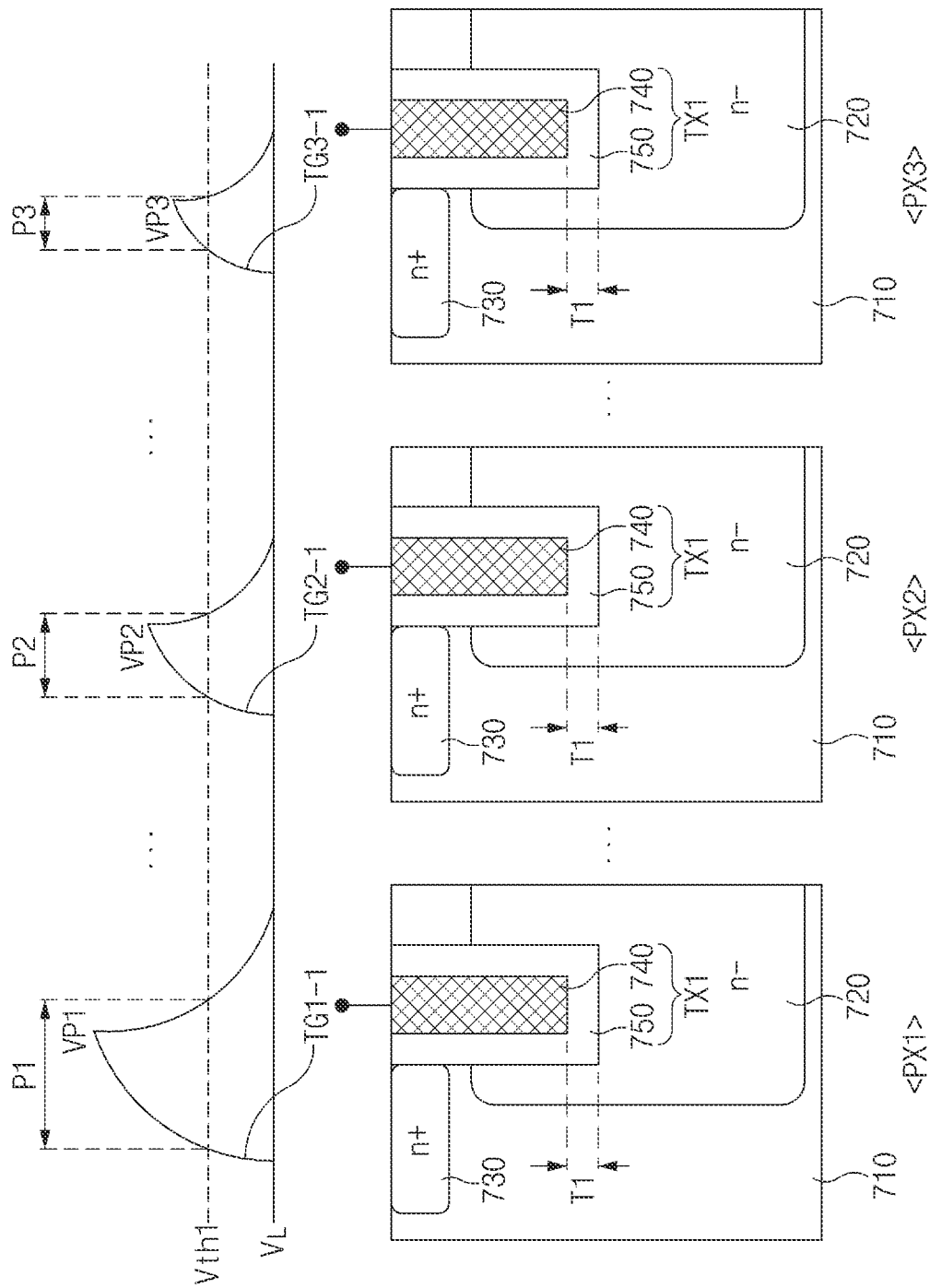
FIG. 7 is a schematic diagram illustrating an example of a pixel array.

FIG. 7 is a schematic diagram illustrating the first pixel PX1, the second pixel PX2, and the third pixel PX3. It should be noted that FIG. 7 briefly illustrates only a substrate 710, a photoelectric conversion layer 720, a first transfer gate TX1 and a first floating diffusion (FD) node 730 among other constituent elements of each of the first to third pixels PX1-PX3. Each of the first to third pixels PX1-PX3 shown in FIG. 7 may have a structure and operation corresponding to the pixel 100 shown in FIG. 2A.

In FIG. 7, it is assumed that each of the first to third pixels PX1-PX3 performs operations corresponding to the first period.

The first transfer gate TX1 included in each of the first to third pixels PX1-PX3 may include a first gate electrode 740 vertically extending into the substrate 710, and a first gate insulation layer 750 surrounding the first gate electrode 740.

In this case, all of the first gate insulation layers 750 of the first transfer gates TX1 of the first to third pixels PX1-PX3 may have the same first thickness T1. In some implementations of the disclosed technology, it is assumed that an arbitrary gate insulation layer has a uniform thickness. That is, a thickness T1 of the first gate insulation layer 750 disposed below the first gate electrode 740 may be identical to a thickness of the first gate insulation layer 750 disposed at both sides (i.e., left and right sides) of the first gate electrode 740.

The first transfer gate TX1 of the first pixel PX1 may receive a first input transmission (Tx) signal TG1-1. The first input transmission (Tx) signal TG1-1 may correspond to the first transmission (Tx) signal shown in FIG. 2A.

The first transfer gate TX1 of the second pixel PX2 may receive a second input transmission signal TG2-1. The second input transmission (Tx) signal TG2-1 may correspond to the first transmission (Tx) signal shown in FIG. 2A.

The first transfer gate TX1 of the third pixel PX3 may receive a third input transmission signal TG3-1. The third input transmission (Tx) signal TG3-1 may correspond to the first transmission (Tx) signal shown in FIG. 2A.

On the other hand, in the first period, the first input transmission (Tx) signal TG1-1 applied to the first transfer gate TX1 of the first pixel PX1, the second input transmission (Tx) signal TG2-1 applied to the first transfer gate TX1 of the second pixel PX2, and the third input transmission (Tx) signal TG3-1 applied to the first transfer gate TX1 of the third pixel PX3 are illustrated in FIG. 7.

Pulse waveforms of the first to third input transmission (Tx) signals TG1-1-TG3-1 shown in FIG. 7 may be identical to those of the first to third input transmission (Tx) signals TG1-TG3 shown in FIG. 4, respectively.

The first transfer gate TX1 of the first pixel PX1, the first transfer gate TX1 of the second pixel PX2, and the first transfer gate TX1 of the third pixel PX3 may be identical in structure to each other, such that the first transfer transistors of the first to third pixels PX1-PX3 may have the same first threshold voltage ($V_{th1}$). Accordingly, a second activation time P2 may be shorter than a first activation time P1, and a third activation time P3 may be shorter than a second activation time P2. In other words, as the distance from the pixel to the transmission (Tx) driver 42 increases, an activation time of the first transmission (Tx) signal may decrease, such that photocharge transfer capability of the first transfer gate TX1 may also decrease. As a result, photocharges generated in the first period may remain in the photoelectric conversion layer 720 without being completely transferred to the first floating diffusion (FD) node 730.

That is, the amount of residual photocharges included in the photoelectric conversion layer 720 in the first period may sequentially increase in the direction from the first pixel PX1 to the third pixel PX3, such that the amount of noise caused by IR drop may also increase.

Figure 8:
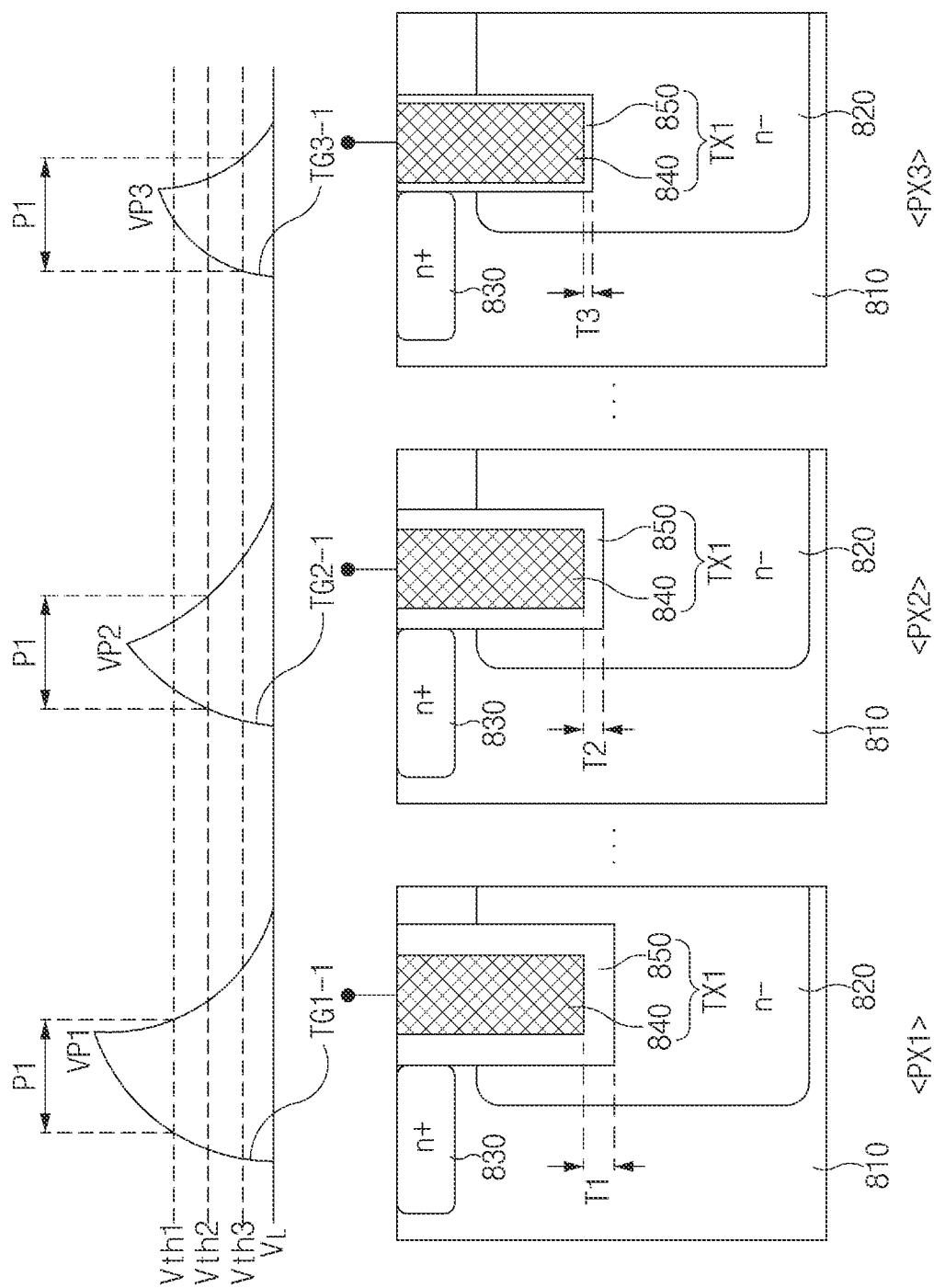
FIG. 8 is a schematic diagram illustrating an example of a pixel array based on some implementations of the disclosed technology.

FIG. 8 is a schematic diagram illustrating an example of the pixel array based on some implementations of the disclosed technology.

FIG. 8 is a structural diagram illustrating the first pixel PX1, the second pixel PX2, and the third pixel PX3 based on some other implementations of the disclosed technology. FIG. 8 illustrates unique characteristics different from those of the comparative example shown in FIG. 7, such that the pixel array shown in FIG. 8 will hereinafter be described centering upon such characteristics different from those of the pixel array shown in FIG. 7 for convenience of description. It should be noted that FIG. 8 briefly illustrates only a substrate 810, a photoelectric conversion layer 820, a first transfer gate TX1, and a first floating diffusion (FD) node 830 from among all constituent elements of each of the first to third pixels PX1-PX3 for convenience of description.

Each of the first to third pixels PX1-PX3 shown in FIG. 8 may have a structure and operation corresponding to the pixel 100 shown in FIG. 2A.

Unlike FIG. 7, the first transfer gate TX1 included in the first pixel PX1 shown in FIG. 8 may include a first gate insulation layer 850 having a first thickness T1, the first transfer gate TX1 included in the second pixel PX2 shown in FIG. 8 may include a first gate insulation layer 850 having a second thickness T2, and the first transfer gate TX1 included in the third pixel PX3 shown in FIG. 8 may include a first gate insulation layer 850 having a third thickness T3. Here, the first thickness T1, the second thickness T2, and the third thickness T3 may sequentially decrease in the direction from the first pixel PX1 to the third pixel PX3. That is, the first gate insulation layer 850 included in the first transfer gate TX1 may sequentially decrease in the direction from the first pixel PX1 to the third pixel PX3.

A threshold voltage of the first transfer transistor formed by the first transfer gate TX1 may be determined by the structure of the first transfer gate TX1. For example, as the thickness of the first gate insulation layer 850 for isolating a first gate electrode 840 and the substrate 810 from each other decreases, the threshold voltage of the first transfer transistor may also decrease.

In other words, as the thickness of the first gate insulation layer 850 included in the first transfer gate TX1 sequentially decreases in the direction from the first pixel PX1 to the third pixel PX3, the threshold voltage of the first transfer transistor may also sequentially decrease in the direction from the first pixel PX1 to the third pixel PX3. Thus, the first threshold voltage ($V_{th1}$) is larger than the second threshold voltage ($V_{th2}$) and the third threshold voltage ($V_{th3}$), and the second threshold voltage ($V_{th2}$) is larger than the third threshold voltage ($V_{th3}$).

Pulse-shaped voltages of the first to third input transmission (Tx) signals TG1-1, TG2-1, and TG3-1 may decrease in the direction from the first pixel PX1 to the third pixel PX3. In more detail, the pulse-shaped voltage of the first input transmission (Tx) signal TG1-1 of the first pixel PX1 may be higher than the pulse-shaped voltage of the second input transmission (Tx) signal TG2-1 of the second pixel PX2, and the pulse-shaped voltage of the second input transmission (Tx) signal TG2-1 of the second pixel PX2 may be higher than the pulse-shaped voltage of the third input transmission (Tx) signal TG3-1 of the third pixel PX3. As a result, when the first transfer transistors of the first to third pixels PX1-PX3 have the same first threshold voltage as shown in FIG. 7, the activation time may be sequentially shortened in the direction from the first pixel PX1 to the third pixel PX3.

However, in the first to third pixels PX1-PX3 based on another implementation of the disclosed technology, the thickness of the first gate insulation layer 850 may sequentially decrease in the direction from the first pixel PX1 to the third pixel PX3, a threshold voltage of the first transfer transistor may sequentially decrease in the direction from the first threshold voltage ($V_{th1}$) to the third threshold voltage ($V_{th3}$). As a result, the activation time in the first to third pixels PX1-PX3 may be kept at a first activation time P1, and the first transfer gates TX1 of the first to third pixels PX1-PX3 may have similar photocharge transfer capabilities.

Therefore, although a voltage drop of the first transmission (Tx) signal (or the second transmission (Tx) signal) gradually increases in the direction from the near-field region AR_N to the far-field region AR_F, the intensity of pixel signals can be kept constant (or uniform) throughout the pixel array 30 under the condition that a uniform light signal is used, such that noise caused by IR drop can be prevented from flowing into the pixel array 30.

In each of the near-field region AR_N, the central region AR_C, and the far-field region AR_F, the thickness of the first gate insulation layer included in the first transfer gate TX1 and the thickness of the second gate insulation layer included in the second transfer gate TX2 can be determined experimentally to implement uniform photocharge transfer capability throughout the pixel array 30.

Although FIGS. 7 and 8 illustrate the first transfer gates as an example, the substantially same technical features can also be applied to the second transfer gate as necessary.

Although FIGS. 5 to 8 have independently illustrated some implementations of the pixel array in which the photocharge collection capability or the photocharge transfer capability can be adjusted uniformly in the direction from the near-field region AR_N to the far-field region AR_F, the scope or spirit of the disclosed technology is not limited thereto, and two implementations described in FIGS. 6 and 8 may be combined with each other as needed. For example, as the depth of each of the first and second transfer gates TX1 and TX2 sequentially increases in the direction from the near-field region AR_N to the far-field region AR_F, the thickness of each of the first and second gate insulation layers respectively included in the first and second transfer gates TX1 and TX2 may also decrease.

Figure 9:
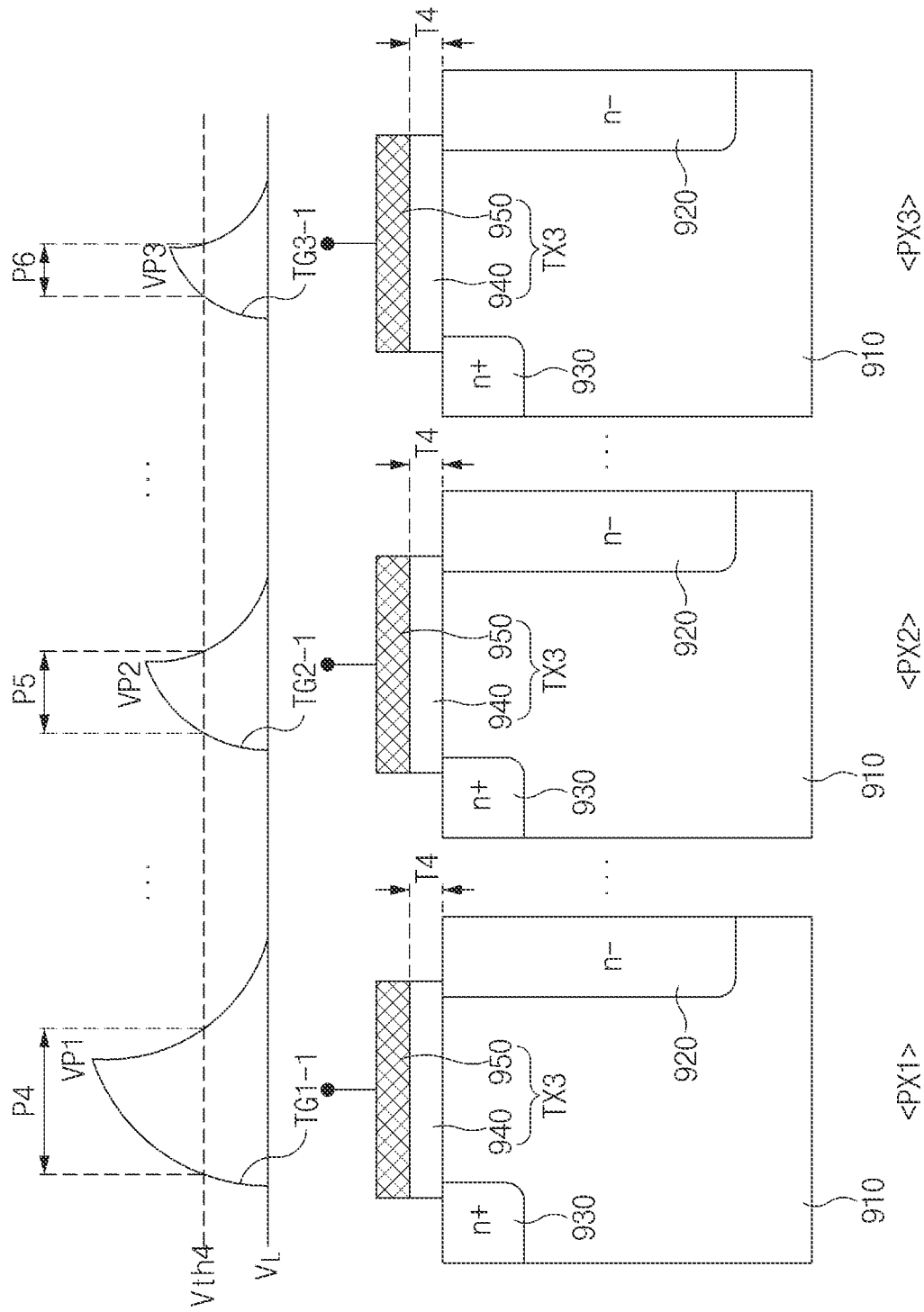
FIG. 9 is a schematic diagram illustrating an example of a pixel array.

FIG. 9 is a schematic diagram illustrating an example of the pixel array according to a comparative example of the disclosed technology.

FIG. 9 is a structural diagram illustrating the first pixel PX1, the second pixel PX2, and the third pixel PX3. FIG. 9 illustrates unique characteristics different from those of the comparative example shown in FIG. 8, and thus the discussion on the pixel array shown in FIG. 9 will focus on such characteristics different from those of the pixel array shown in FIG. 8. It should be noted that FIG. 9 briefly illustrates only a substrate 910, a photoelectric conversion layer 920, a third transfer gate TX3, and a third floating diffusion (FD) node 930, among other constituent elements of each of the first to third pixels PX1-PX3. Each of the first to third pixels PX1-PX3 shown in FIG. 9 may have a structure and operation corresponding to the pixel 200 shown in FIG. 2B.

In FIG. 9, it is assumed that each of the first to third pixels PX1-PX3 performs operations corresponding to the first period.

A third transfer gate TX3 included in each of the first to third pixels PX1-PX3 may include a third gate insulation layer 940 and a third gate electrode 950 that are sequentially deposited over the substrate 910. In a situation in which at least a portion of each of the third gate insulation layer 940 and the third gate electrode 950 overlaps with the photoelectric conversion layer 920 and the third floating diffusion (FD) node 930, the third gate insulation layer 940 and the third gate electrode 950 may be disposed over a region between the photoelectric conversion layer 920 and the third floating diffusion (FD) node 930.

In this case, the third gate insulation layers 940 of the third transfer gates TX3 included in the first to third pixels PX1-PX3 may have the same fourth thickness T4.

The third transfer gate TX3 of the first pixel PX1 may receive a first input transmission (Tx) signal TG1-1. The first input transmission (Tx) signal TG1-1 may correspond to the first transmission (Tx) signal shown in FIGS. 2A and 2B.

The third transfer gate TX3 of the second pixel PX2 may receive a second input transmission (Tx) signal TG2-1. The second input transmission (Tx) signal TG2-1 may correspond to the first transmission (Tx) signal shown in FIGS. 2A and 2B.

The third transfer gate TX3 of the third pixel PX3 may receive a third input transmission (Tx) signal TG3-1. The third input transmission (Tx) signal TG3-1 may correspond to the first transmission (Tx) signal shown in FIGS. 2A and 2B.

On the other hand, in the first period, the first input transmission (Tx) signal TG1-1 applied to the third transfer gate TX3 of the first pixel PX1, the second input transmission (Tx) signal TG2-1 applied to the third transfer gate TX3 of the second pixel PX2, and the third input transmission (Tx) signal TG3-1 applied to the third transfer gate TX3 of the third pixel PX3 are illustrated in FIG. 9.

Pulse waveforms of the first to third input transmission (Tx) signals TG1-1-TG3-1 shown in FIG. 9 may be identical to those of the first to third input transmission (Tx) signals TG1-TG3 shown in FIG. 4, respectively.

The third transfer gate TX3 of the first pixel PX1, the third transfer gate TX3 of the second pixel PX2, and the third transfer gate TX3 of the third pixel PX3 may be identical in structure to each other, such that the first transfer transistors of the first to third pixels PX1-PX3 may have the same fourth threshold voltage ($V_{th4}$). Accordingly, a fifth activation time P5 may be shorter than a fourth activation time P4, and a sixth activation time P6 may be shorter than the fifth activation time P5. In other words, as the distance from the pixel to the transmission (Tx) driver 42 increases, an activation time of the first transmission (Tx) signal may decrease, such that photocharge transfer capability of the third transfer gate TX3 may also decrease. As a result, photocharges generated in the first period may remain in the photoelectric conversion layer 920 without being completely transferred to the third floating diffusion (FD) node 930.

That is, the amount of residual photocharges included in the photoelectric conversion layer 920 in the first period may increase in the direction from the first pixel PX1 to the third pixel PX3, such that the amount of noise caused by IR drop may also increase.

Figure 10:
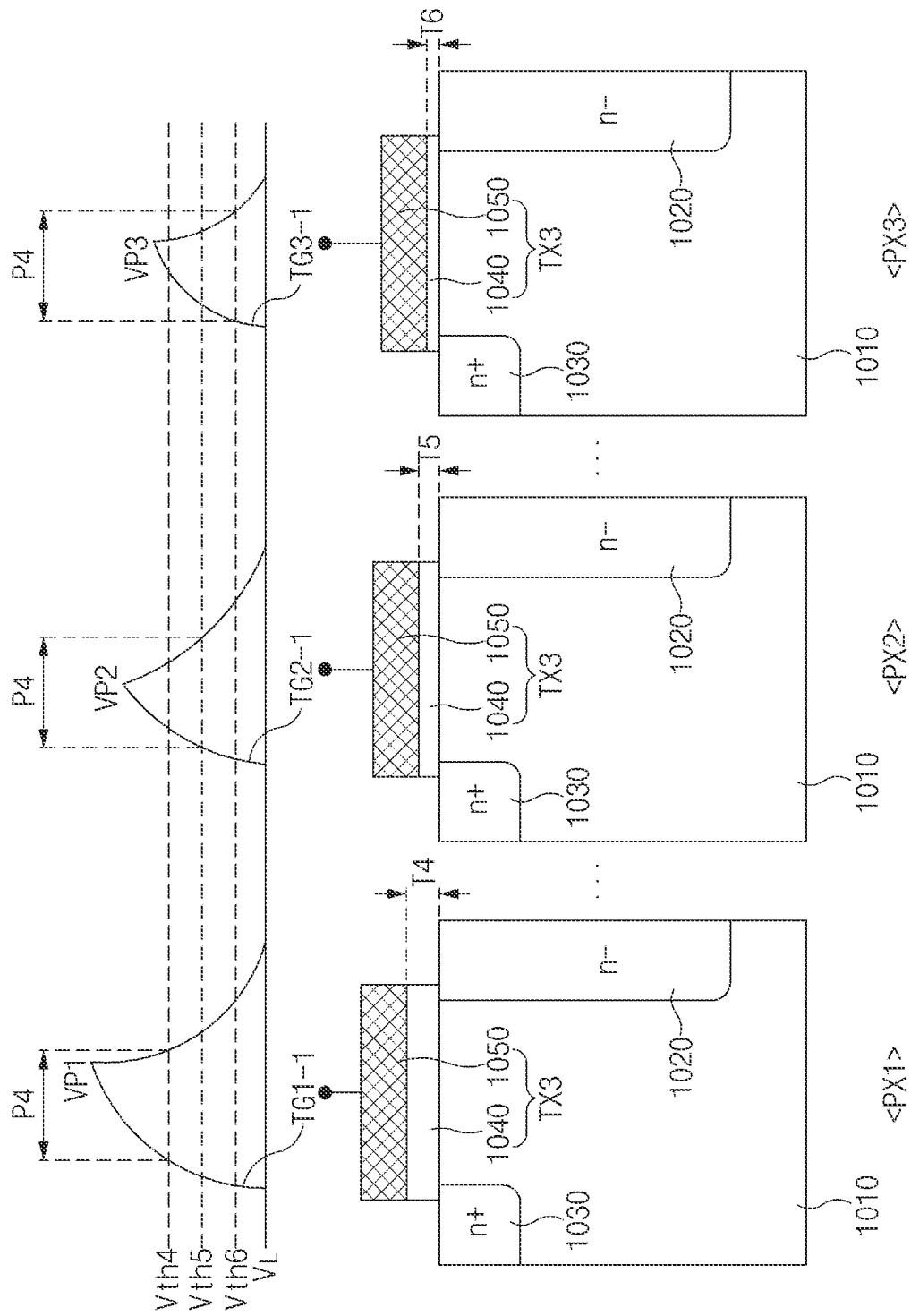
FIG. 10 is a schematic diagram illustrating an example of a pixel array based on some other implementations of the disclosed technology.

FIG. 10 is a schematic diagram illustrating an example of the pixel array based on some other implementations of the disclosed technology.

FIG. 10 is a structural diagram illustrating the first pixel PX1, the second pixel PX2, and the third pixel PX3 based on yet another implementation of the disclosed technology. FIG. 10 illustrates unique characteristics different from those of the comparative example shown in FIG. 9, and thus the discussion on the pixel array shown in FIG. 10 will focus on such characteristics different from those of the pixel array shown in FIG. 9 for convenience of description. It should be noted that FIG. 10 briefly illustrates only a substrate 1010, a photoelectric conversion layer 1020, a third transfer gate TX3, and a third floating diffusion (FD) node 1030, among other constituent elements of each of the first to third pixels PX1-PX3 for convenience of description. Each of the first to third pixels PX1-PX3 shown in FIG. 10 may have a structure and operation corresponding to the pixel 200 shown in FIG. 2B.

Unlike FIG. 9, the third transfer gate TX3 included in the first pixel PX1 shown in FIG. 10 may include a third gate insulation layer 1040 having a fourth thickness T4, the third transfer gate TX3 included in the second pixel PX2 shown in FIG. 10 may include a third gate insulation layer 1040 having a fifth thickness T5, and the third transfer gate TX3 included in the third pixel PX3 shown in FIG. 10 may include a third gate insulation layer 1040 having a sixth thickness T6. Here, the fourth thickness T4, the fifth thickness T5, and the sixth thickness T6 may sequentially decrease in the direction from the first pixel PX1 to the third pixel PX3. That is, a thickness of a third gate electrode 1050 included in the third transfer gate TX3 may maintain the same in the direction from the first pixel PX1 to the third pixel PX3, and the thickness of the third gate insulation layer 1040 may sequentially decrease in the direction from the first pixel PX1 to the third pixel PX3.

A threshold voltage of the first transfer transistor formed by the third transfer gate TX3 may be determined by the structure of the third transfer gate TX1. For example, as the thickness of the third gate insulation layer 1040 for isolating the third gate electrode 1050 and the substrate 1010 from each other decreases, the threshold voltage of the first transfer transistor may also decrease.

In other words, as the thickness of the third gate insulation layer 1040 included in the third transfer gate TX3 sequentially decreases in the direction from the first pixel PX1 to the third pixel PX3, the threshold voltage of the first transfer transistor may also sequentially decrease in the direction from the first pixel PX1 to the third pixel PX3. Thus, the fourth threshold voltage ($V_{th4}$) is larger than the fifth threshold voltage ($V_{th5}$) and the sixth threshold voltage ($V_{th6}$), and the fifth threshold voltage ($V_{th5}$) is larger than the sixth threshold voltage ($V_{th6}$).

Pulse-shaped voltages of the first to third input transmission (Tx) signals TG1-1, TG2-1, and TG3-1 may decrease in the direction from the first pixel PX1 to the third pixel PX3. In more detail, the pulse-shaped voltage of the first input transmission (Tx) signal TG1-1 of the first pixel PX1 may be higher than the pulse-shaped voltage of the second input transmission (Tx) signal TG2-1 of the second pixel PX2, and the pulse-shaped voltage of the second input transmission (Tx) signal TG2-1 of the second pixel PX2 may be higher than the pulse-shaped voltage of the third input transmission (Tx) signal TG3-1 of the third pixel PX3. As a result, when the first transfer transistors of the first to third pixels PX1-PX3 have the same fourth threshold voltage as shown in FIG. 9, the activation time may be sequentially shortened in the direction from the first pixel PX1 to the third pixel PX3.

However, in the first to third pixels PX1-PX3 based on a yet another implementation of the disclosed technology, the thickness of the third gate insulation layer 1040 may sequentially decrease in the direction from the first pixel PX1 to the third pixel PX3, a threshold voltage of the first transfer transistor may sequentially decrease in the direction from the fourth threshold voltage ($V_{th4}$) to the sixth threshold voltage ($V_{th6}$). As a result, the activation time in the first to third pixels PX1-PX3 may be kept at a fourth activation time P4, and the third transfer gates TX3 of the first to third pixels PX1-PX3 may have similar photocharge transfer capabilities.

Therefore, although a voltage drop of the first transmission (Tx) signal (or the second transmission (Tx) signal) gradually increases in the direction from the near-field region AR_N to the far-field region AR_F, the intensity of pixel signals can be kept constant (or uniform) throughout the pixel array 30 under the condition that a uniform light signal is used, such that noise caused by IR drop can be prevented from flowing into the pixel array 30.

Although FIGS. 9 and 10 illustrate the third transfer gates as an example, the substantially same technical features can also be applied to the fourth transfer gate as necessary.

In each of the near-field region AR_N, the central region AR_C, and the far-field region AR_F, the thickness of the third gate insulation layer included in the third transfer gate TX3 and the thickness of the fourth gate insulation layer included in the fourth transfer gate TX4 can be determined experimentally to implement uniform photocharge transfer capability throughout the pixel array 30.

In addition, the above-mentioned implementations of the disclosed technology have disclosed that the pixel array 30 includes the near-field region AR_N, the central region AR_C, and the far-field region AR_F for convenience of description, the scope or spirit of the disclosed technology is not limited thereto, and the structure of the pixel contained in the pixel array 30 can be constructed in different ways according to the respective regions AR_N, AR_C, and AR_F. Here, the pixel array 30 may be divided into a plurality of regions corresponding to any number (up to 'N') of pixels, such that the pixel array 30 can be constructed in a manner that the photocharge collection capability and/or the photocharge transfer capability can be kept constant (or uniform) throughout the pixel array 30 irrespective of the increasing distance between each pixel and the transmission (Tx) driver 42.

Although the above-mentioned implementations of the disclosed technology have disclosed that the depths of the transfer gates and/or the thicknesses of gate insulation layers are differently adjusted to implement uniform photocharge collection capability and/or uniform photocharge transfer capability throughout the pixel array 30, irrespective of the distance between each pixel and the transmission (Tx) driver 42, the scope or spirit of the disclosed technology is not limited thereto.

In one implementation of the disclosed technology, in order to acquire the same effects as those of the above-mentioned structures, the width and/or length of the channel region disposed below the transfer gate may be adjusted, such that the threshold voltage of the transfer transistors can also be adjusted. That is, in a pixel located relatively closer to the transmission (Tx) driver 42, the channel region disposed below the transfer gate in the pixel may be formed to have a relatively smaller width and/or a relatively longer length. In contrast, in a pixel located relatively farther from the transmission (Tx) driver 42, the channel region disposed below the transfer gate in the pixel may be formed to have a relatively larger width and/or a relatively shorter length. Here, the shape of the channel region disposed below the transfer gate can be adjusted by changing the shape of the transfer gate and the shape or position of the floating diffusion (FD) node and the photoelectric conversion element that are disposed below the transfer gate.

In another implementation of the disclosed technology, in order to acquire the same effects as those of the above-mentioned structures, the threshold voltage of the transfer transistor can be adjusted by changing materials of the gate electrode included in the transfer gate to other materials. That is, in a pixel located relatively closer to the transmission (Tx) driver 42, the gate electrode for the pixel may include a material (e.g., aluminum Al) having a relatively low work function, such that the threshold voltage of the pixel can relatively increase. In contrast, in a pixel located relatively farther from the transmission (Tx) driver 42, the gate electrode for the pixel may include a material (e.g., tungsten W) having a relatively high work function, such that the threshold voltage of the pixel can relatively decrease.

In yet another implementation of the disclosed technology, in order to acquire the same effects as those of the above-mentioned structures, the threshold voltage of the transfer transistor can be adjusted by changing materials of the gate insulation layer included in the transfer gate to other materials. That is, in a pixel located relatively closer to the transmission (Tx) driver 42, the gate insulation layer for the pixel may include a material (e.g., hafnium oxide $HfO_2$) having a relatively high dielectric constant, such that the threshold voltage of the pixel can relatively increase. In contrast, in a pixel located relatively farther from the transmission (Tx) driver 42, the gate insulation layer for the pixel may include a material (e.g., aluminum oxide $Al_2O_3$) having a relatively low dielectric constant, such that the threshold voltage of the pixel can relatively decrease.

As is apparent from the above description, the image sensing device based on some implementations of the disclosed technology can enable a transfer gate to be formed in different ways according to the position of a pixel, and can thus remove noise caused by IR drop (e.g., voltage drop) from a pixel signal.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that various modifications or enhancements to the disclosed embodiments and other embodiments can be devised based on what is described and/or illustrated in this patent document.

What is claimed is:

1. An image sensing device comprising:
    a substrate;
    an image sensor pixel array supported by the substrate and structured to include a plurality of image sensor pixels that generate photocharges in response to light, the plurality of image sensor pixels including a first image sensor pixel and a second image sensor pixel, each of the first and second image sensor pixels including a first transfer gate and a second transfer gate, the first transfer gate structured to transfer photocharges generated during a first period to a first region structured to hold the photocharges, the second transfer gate structured to transfer photocharges generated during a second period to a second region structured to hold the photocharges; and
    a transmission driver coupled to the first and second transfer gates, and configured to apply a first transmission signal to the first transfer gate to control the first transfer gate and a second transmission signal to the second transfer gate to control the second transfer gate,
    wherein a first distance between the first image sensor pixel and the transmission driver is shorter than a second distance between the second image sensor pixel and the transmission driver, and
    wherein the first and second transfer gates of the first image sensor pixel are different in structure from the first and second transfer gates of the second image sensor pixel, respectively.

2. The image sensing device according to claim 1, wherein each of the first transfer gate and the second transfer gate has a recess structure formed within the substrate.

3. The image sensing device according to claim 2, wherein:
- a depth of the recess structure of the first transfer gate of the first image sensor pixel in the substrate is less than a depth of the recess structure of the first transfer gate of the second image sensor pixel in the substrate; and
- a depth of the recess structure of the second transfer gate of the first image sensor pixel in the substrate is less than a depth of the recess structure of the second transfer gate of the second image sensor pixel in the substrate.

4. The image sensing device according to claim 2, wherein:
- the first transfer gate includes a first gate electrode structured to receive the first transmission signal and a first gate insulation layer structured to surround the first gate electrode;
- the second transfer gate includes a second gate electrode structured to receive the second transmission signal and a second gate insulation layer structured to surround the second gate electrode;
- a thickness of the first gate insulation layer of the first image sensor pixel is larger than a thickness of the first gate insulation layer of the second image sensor pixel; and
- a thickness of the second gate insulation layer of the first image sensor pixel is larger than a thickness of the second gate insulation layer of the second image sensor pixel.

5. The image sensing device according to claim 1, wherein each of the first transfer gate and the second transfer gate has a planar structure extending along one surface of the substrate.

6. The image sensing device according to claim 5, wherein:
- the first transfer gate includes a first gate electrode structured to receive the first transmission signal and a first gate insulation layer disposed between the first gate electrode and the substrate;
- the second transfer gate includes a second gate electrode structured to receive the second transmission signal and a second gate insulation layer disposed between the second gate electrode and the substrate;
- a thickness of the first gate insulation layer of the first image sensor pixel is larger than a thickness of the first gate insulation layer of the second image sensor pixel; and
- a thickness of the second gate insulation layer of the first image sensor pixel is larger than a thickness of the second gate insulation layer of the second image sensor pixel.

7. The image sensing device according to claim 1, wherein:
- a threshold voltage of a transistor corresponding to the first transfer gate of the first image sensor pixel is higher than a threshold voltage of a transistor corresponding to the first transfer gate of the second image sensor pixel; and
- a threshold voltage of a transistor corresponding to the second transfer gate of the first image sensor pixel is higher than a threshold voltage of a transistor corresponding to the second transfer gate of the second image sensor pixel.

8. The image sensing device according to claim 1, wherein:
- an activation time of the first transmission signal applied to the first transfer gate of the first image sensor pixel is identical to an activation time of the first transmission signal applied to the first transfer gate of the second image sensor pixel; and
- an activation time of the second transmission signal applied to the second transfer gate of the first image sensor pixel is identical to an activation time of the second transmission signal applied to the second transfer gate of the second image sensor pixel.

9. The image sensing device according to claim 1, wherein the first image sensor pixel and the second image sensor pixel are coupled to the transmission driver through the same transmission signal line.

10. An image sensing device comprising:
- an image sensor pixel array including a plurality of image sensor pixels structured to include photoelectric conversion elements, respectively, that generate photocharges in response to light, each of the plurality of image sensor pixels including a first floating diffusion region adjacent to a corresponding photoelectric conversion element, a first transfer gate coupled between the photoelectric conversion element and the first floating diffusion region, a second floating diffusion region adjacent to the photoelectric conversion element but separate from the first floating diffusion region, and a second transfer gate coupled between the photoelectric conversion element and the second floating diffusion region, the first transfer gate structured to be operable to transfer first photocharges generated in the corresponding photoelectric conversion element during a first period to the first floating diffusion region which holds the first photocharges, and the second transfer gate structured to be operable to transfer second photocharges generated in the corresponding photoelectric conversion element during a second period to the second floating diffusion region which holds the second photocharges; and
- a transmission driver coupled to the first and second transfer gates and configured to apply a first transmission signal to the first transfer gate to operate the first transfer gate to transfer the first photocharges and a second transmission signal to the second transfer gate to operate the second transfer gate to transfer the second photocharges,
- wherein the plurality of image sensor pixels includes first to third image sensor pixels that have different signal transmission distances from the transmission driver, and
- wherein the first transfer gate of the first image sensor pixel, the first transfer gate of the second image sensor pixel and the first transfer gate of the third image sensor pixel have different structures, including at least one of a depth of the first transfer gate in a substrate, a material of a gate electrode of the first transfer gate, a thickness of a gate insulation layer of the first transfer gate, or a material of the gate insulation layer.

11. The image sensing device according to claim 10, wherein:
- a depth of the first transfer gate of the first image sensor pixel in the substrate is less than a depth of the first transfer gate of the second image sensor pixel in the substrate;
- a depth of the first transfer gate of the second image sensor pixel in the substrate is less than a depth of the first transfer gate of the third image sensor pixel in the substrate;

a depth of the second transfer gate of the first image sensor pixel in the substrate is less than a depth of the second transfer gate of the second image sensor pixel in the substrate; and a depth of the second transfer gate of the second image sensor pixel in the substrate is less than a depth of the second transfer gate of the third image sensor pixel in the substrate.

12. The image sensing device according to claim 10, wherein:

the first transfer gate includes a first gate electrode structured to receive the first transmission signal and a first gate insulation layer disposed below the first gate electrode; and the second transfer gate includes a second gate electrode structured to receive the second transmission signal and a second gate insulation layer disposed below the second gate electrode.

13. The image sensing device according to claim 12, wherein:

a thickness of the first gate insulation layer of the first image sensor pixel is larger than a thickness of the first gate insulation layer of the second image sensor pixel;

a thickness of the first gate insulation layer of the second image sensor pixel is larger than a thickness of the first gate insulation layer of the third image sensor pixel;

a thickness of the second gate insulation layer of the first image sensor pixel is larger than a thickness of the second gate insulation layer of the second image sensor pixel; and a thickness of the second gate insulation layer of the second image sensor pixel is larger than a thickness of the second gate insulation layer of the third image sensor pixel.

14. The image sensing device according to claim 12, wherein:

a dielectric constant of the first gate insulation layer of the first image sensor pixel is larger than a dielectric constant of the first gate insulation layer of the second image sensor pixel;

a dielectric constant of the first gate insulation layer of the second image sensor pixel is larger than a dielectric constant of the first gate insulation layer of the third image sensor pixel;

a dielectric constant of the second gate insulation layer of the first image sensor pixel is larger than a dielectric constant of the second gate insulation layer of the second image sensor pixel; and a dielectric constant of the second gate insulation layer of the second image sensor pixel is larger than a dielectric constant of the second gate insulation layer of the third image sensor pixel.

15. The image sensing device according to claim 12, wherein:

a work function of the first gate electrode of the first image sensor pixel is less than a work function of the first gate electrode of the second image sensor pixel;

a work function of the first gate electrode of the second image sensor pixel is less than a work function of the first gate electrode of the third image sensor pixel;

a work function of the second gate electrode of the first image sensor pixel is less than a work function of the second gate electrode of the second image sensor pixel; and a work function of the second gate electrode of the second image sensor pixel is less than a work function of the second gate electrode of the third image sensor pixel.

* * * * *